US008380140B2

(12) United States Patent
Utagawa et al.

(10) Patent No.: US 8,380,140 B2
(45) Date of Patent: Feb. 19, 2013

(54) MICROWAVE/MILLIMETER WAVE COMMUNICATION APPARATUS

(75) Inventors: Hitoshi Utagawa, Koganei (JP); Toshiaki Matsui, Koganel (JP)

(73) Assignees: National Institute of Information and Communications Technology, Koganei-shi (JP); Communications Research Laboratory, Inc., Koganei-shi (JP)

( * ) Notice: Subject to any disclaimer, the term of this patent is extended or adjusted under 35 U.S.C. 154(b) by 37 days.

(21) Appl. No.: 13/121,063

(22) PCT Filed: Sep. 26, 2008

(86) PCT No.: PCT/JP2008/068000
§ 371 (c)(1),
(2), (4) Date: Jun. 13, 2011

(87) PCT Pub. No.: WO2010/035349
PCT Pub. Date: Apr. 1, 2010

(65) Prior Publication Data
US 2011/0244801 A1    Oct. 6, 2011

(51) Int. Cl.
*H04B 1/40* (2006.01)
*H03B 7/00* (2006.01)
(52) U.S. Cl. .......... 455/84; 455/205; 455/333; 331/115; 331/132
(58) Field of Classification Search ............ 455/73, 455/84, 129, 205, 333; 331/107 R, 108 R, 331/115, 132
See application file for complete search history.

(56) References Cited

U.S. PATENT DOCUMENTS
5,511,238 A * 4/1996 Bayraktaroglu ............... 455/81
(Continued)

FOREIGN PATENT DOCUMENTS
JP    11 31918    2/1999
JP    2000 261234    9/2000
(Continued)

OTHER PUBLICATIONS

Kishi, A. et al., "A Planar Radiating Oscillator using Fan-Shaped Patch Elements", Communications Research Laboratory, University of Electro-Communications, Total pp. 5, (Mar. 8, 1999).

(Continued)

*Primary Examiner* — Quochien B Vuong
(74) *Attorney, Agent, or Firm* — Oblon, Spivak, McClelland, Maier & Neustadt, L.L.P.

(57) ABSTRACT

A baseband signal processing unit changes the collector current of a transistor (20) formed by a bias control circuit (7) in accordance with a baseband transmission signal input from a baseband signal input terminal (18), changing the drain bias of a high-frequency transistor (1) to realize frequency modulation by changing the oscillation frequency, and the radiation wave thereof forms a transmit RF signal, whereby the transmission operation is performed. On the other hand, the oscillation signal is synchronized with a frequency modulated RF signal that arrives from outside, the change in frequency caused by the frequency modulation is generated as a change in the drain bias of the high-frequency transistor (1), and reception operation is performed by taking out that change as a voltage amplitude change from the baseband signal output terminal (14). As a result, it is possible to provide a microwave/millimeter wave communication apparatus that is simple in structure, low cost, and low power consumption.

4 Claims, 17 Drawing Sheets

U.S. PATENT DOCUMENTS

| | | | |
|---|---|---|---|
| 5,982,245 | A | 11/1999 | Matsui et al. |
| 6,246,295 | B1 | 6/2001 | Matsui et al. |
| 6,545,553 | B1 * | 4/2003 | Bird et al. ............. 331/107 R |
| 2010/0117891 | A1 | 5/2010 | Utagawa et al. |
| 2010/0315990 | A1 | 12/2010 | Utagawa et al. |

FOREIGN PATENT DOCUMENTS

| | | |
|---|---|---|
| WO | 2007 114522 | 10/2007 |

OTHER PUBLICATIONS

Montiel, C. M. et al., "A Self-Mixing Active Antenna for Communication and Vehicle Identification Applications", TU4C-5, IEEE MTT-S Digest, pp. 333-336, (1996).

Flynt, R. A. et al., "Low Cost and Compact Active Integrated Antenna Transceiver for System Applications", IEEE Transactions on Microwave Theory and Techniques, vol. 44, No. 10, pp. 1642-1649, (Oct. 1996).

Cryan, M. J. et al. "Integrated Active Antenna With Simultaneous Transmit-Receive Operation", Electronics Letters, vol. 32, No. 4, pp. 286 and 287, (Feb. 15, 1996).

Carrez, F. et al., "Integrated Circuit Array Antenna for Short-Rang Communication Systems", Electronics Letters, vol. 34, No. 14, pp. 1370 and 1371, (Jul. 9, 1998).

International Search Report Issued Dec. 16, 2008 in PCT/JP08/068000 filed Sep. 26, 2008.

U.S. Appl. No. 13/123,338, filed Jul. 5, 2011, Utagawa, et al.
U.S. Appl. No. 13/123,115, filed Jul. 12, 2011, Utagawa, et al.
U.S. Appl. No. 13/123,135, filed Apr. 7, 2011, Utagawa, et al.

* cited by examiner

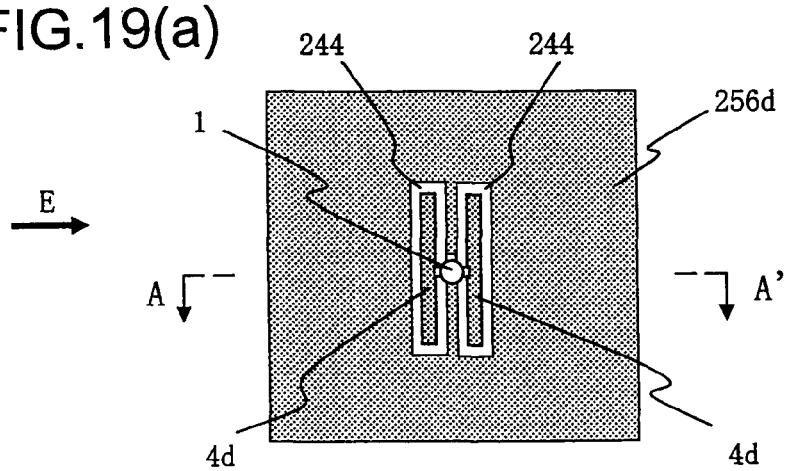
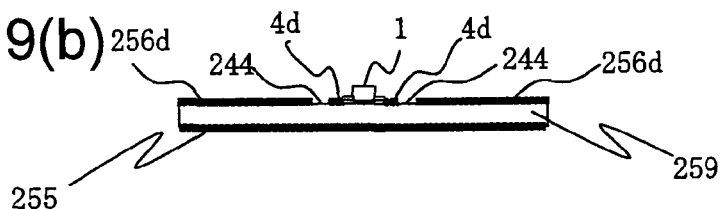
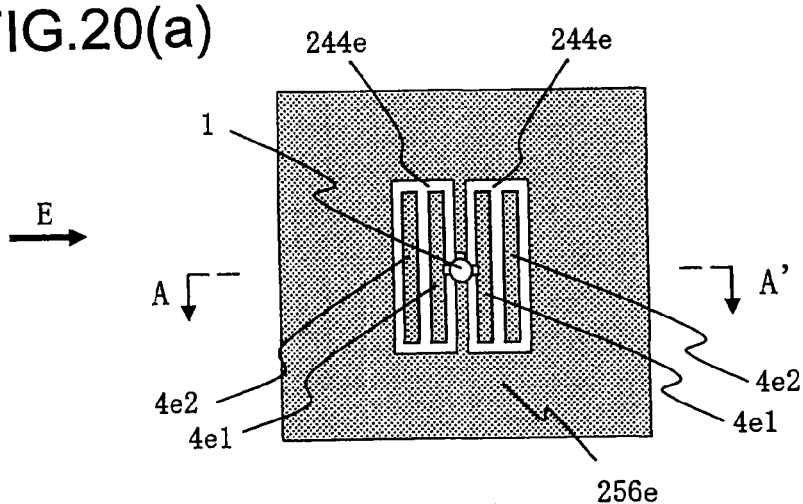
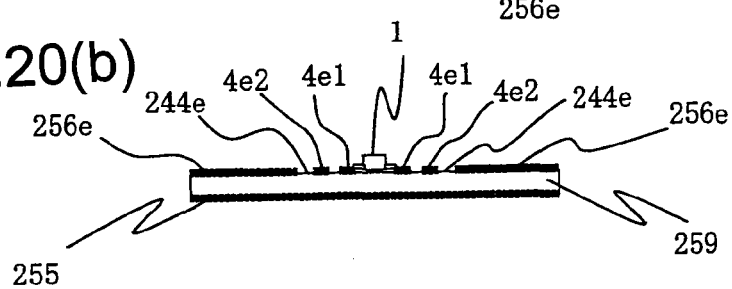

MICROWAVE/MILLIMETER WAVE COMMUNICATION APPARATUS

TECHNICAL FIELD

The present invention relates to a microwave/millimeter wave communication apparatus that uses microwave band waves/millimeter wave band waves to perform wireless communication. It particularly relates to a technology that can provide a microwave/millimeter wave communication apparatus structure that is simple, inexpensive, and has low power consumption.

BACKGROUND ART

The spread of wireless systems that use microwave/millimeter wave band waves for wireless LANs, wireless sensor networks, and wireless transmission of high-quality audio-visual signals and the like has brought with it a demand for lower-priced wireless apparatuses. In particular, a feature of millimeter wave band communication is that the apparatus can be miniaturized, which is expected to lead to its widespread utilization for short-range communication in the home and office. On the other hand, the promotion of its use and its popularity are hindered by the problems of the high cost of developing and manufacturing the communication apparatuses due to the extremely high frequencies, and poor power efficiency.

A conventional, general microwave/millimeter wave communication apparatus comprises forming an RF transmission/reception circuit by connecting together the functional circuits with a transmission line, and using a power supply line to connect the transmission/reception circuit and the antenna. For example a structure in which an oscillator MMIC (Monolithic Microwave Integrated Circuit) chip, an amplifier MMIC chip, mixer MMIC chip and microstrip type patch antenna are connected by a microstrip line.

In such a communication apparatus formed by connecting individual circuits, there is a limit to the high-density integration of circuits. With millimeter wave bands in particular, loss due to the connecting portions between the functional circuits and loss due to the transmission line are major causes of circuit performance degradation. To counter such problems in a communication apparatus in which individual circuits are connected, there have been proposed active antenna technology that integrates the antenna and the RF circuit section, and a communication apparatus that aims at achieving simple structure, low cost, and low power consumption by utilizing radiating oscillator technology that integrates the amplifier element and electromagnetic wave radiation structures.

Examples include a communication apparatus that uses radiating oscillator technology in which a GUNN diode as the oscillating element is mounted inside a conductor patch, (see, for example, C. M. Montiel, L. Fan and K. Chang, "A Self-Mixing Active Antenna for Communication and Vehicle Identification Applications", IEEE MTT-S Digest, pp. 333-336, 1996 (Non-patent Literature 1)), a communication apparatus in which a transistor is placed at the center of two half-round conductor patches capacitively coupled by a capacitor component, a bias chip resistor and Schottky barrier diode are also placed inside the same conductor patch, and the transistor is used as an oscillating element, and the Schottky barrier diode is used as a receiving wave down-conversion mixing element to form a radiating oscillator (see, for example, Robert A. Flynt, "Low Cost and Compact Active Integrated Antenna Transceiver for System Application", MTT-10 vol. 44, October 1996 (Non-patent Literature 2)), a communication apparatus that uses active antenna technology having a structure in which a microstrip line transistor oscillation circuit and a receive wave amplifier circuit on a square conductor patch have the shortest connection on the same plane (see, for example, M. J. Cryan and P. S. Hall, "Integrated active antenna with simultaneous transmit-receive operation", Electronics letters, February 1996 vol. 32, No. 4, pp. 286-287 (Non-patent Literature 3)), and a communication apparatus using active antenna technology having a structure in which a microstrip line transistor resonator circuit is connected to a rectangular conductor patch (see, for example, F. Carrez and J. Vindevoghel, "Integrated circuit array antenna for short-range communication systems", Electronics letters, July 1998 vol. 34, No. 14, pp. 1370-1371 (Non-patent Literature 4)).

With the communication apparatus described in the above Non-patent Literature 1, frequency modulation is generated by superposing a high-frequency signal on the direct-current bias of a GUNN diode and emitting it to an apparatus formed in the same way, causing an injection-locking phenomenon and at the same time transmitting the frequency modulation component to another radiation type oscillator, whereby the high-frequency component is transmitted by the mixing operation of the GUNN diode itself. Via a bias-T circuit, the frequency modulation component is superposed on the direct-current bias or isolated. Also, in using the communication apparatus described in the above Non-patent Literature 2, two communication apparatuses that are the same are used in opposition, positioned with the radiation polarization planes at 90 degrees to each other, so that the oscillated radiation signals do not mutually affect each other. The communication apparatus described in the above Non-patent Literature 3 does not specifically disclose the receive RF signal down-conversion or demodulation operations. Also, the communication apparatus described in the above Non-patent Literature 4 is comprised so that, during the receive operation, it is operated as just a diode wave detector with no direct-current bias applied to the transistor drain, and during transmit operation, the transistor is oscillated and the modulation signal input to the gate for the frequency modulation operation.

However, although with the configuration described in Non-patent Literature 1, there is no power loss from the transmission line, the DC/RF conversion efficiency of the GUNN diode is extremely low compared to that of a transistor, so power consumption is increased and a high heat dissipation structure must be used, so stable operation cannot be expected. In addition, the direct-current bias current provided to the GUNN diode is extremely large compared to when a transistor is used, so to sufficiently superpose the modulation signal component on the direct-current bias requires heavy-current driver circuitry, bias-T with a large current capacity and so forth, driving up the cost. Therefore, a communication apparatus having a simple structure, low cost, and high power efficiency cannot be realized with the invention described in Non-patent Literature 1.

Also, the configuration described in Non-patent Literature 2 is complex, with a plurality of RF band parts being positioned within the conductor patch. Moreover, because the mixing by the Schottky barrier diode is a general down-conversion operation of the oscillation signal as a LO signal, it is necessary to include an oscillation frequency stabilization circuit and synchronization circuit to carry out good communication with frequency modulation and the like, thereby increasing the cost. Therefore, a communication apparatus having a simple structure, low cost, and high power efficiency cannot be realized with the invention described in Non-patent Literature 2.

Also, the circuit of the configuration described in Non-patent Literature 3 is complex, with an electromagnetic coupling that is difficult to avoid between the square conductor patch and the microstrip line, and because it sensitively effects on the radiation output, radiation pattern and oscillation frequency characteristics, it is not practicable to use it as a stable communication apparatus. Further, to obtain an IF signal or baseband signal, it is necessary to equip the output unit of the receive wave amplifier circuit with a mixer and wave detector, making it costly. Therefore, a communication apparatus having a simple structure, low cost, and high power efficiency cannot be realized with the invention described in Non-patent Literature 3.

The circuit of the configuration described in Non-patent Literature 4 is also complex, with an electromagnetic coupling that is difficult to avoid between the square conductor patch and the microstrip line, and because it sensitively effects on the radiation output, radiation pattern and oscillation frequency characteristics, it is not practicable to use it as a stable communication apparatus. Although the single transistor has transmission/reception functions and modulation/demodulation functions, the baseband circuit has a complex configuration because the receive signal is amplitude modulated and the transmit signal is frequency modulated. Also, communication cannot be effected even if two of the same apparatuses are set in opposition, making it necessary to separately prepare a different type of apparatus as the other party to the communication. Therefore, a communication apparatus having a simple structure, low cost, and high power efficiency cannot be realized with the invention described in Non-patent Literature 4.

Thus, an object of the present invention is to solve the problems of complex structure, high cost and high power consumption that have hindered the dissemination of microwave/millimeter wave communication, by providing a microwave/millimeter wave communication apparatus that has a simple structure, low cost, and low power consumption.

DISCLOSURE OF THE INVENTION

To solve the above problems, a microwave/millimeter wave communication apparatus according to claim 1 of the present invention is characterized in comprising a radiation type oscillator formed by integrating a three-electrode high-frequency amplifying device to generate negative resistance at resonating cavities, and to share a function to emit an electromagnetic wave to space, wherein during transmission, an oscillation frequency of the radiation type oscillator is varied in accordance with a baseband signal amplitude to frequency modulate a radiation wave as a transmit RF signal, and during reception, demodulation operation is performed by the oscillation of the radiation type oscillator being injection-locked by a receive RF signal arriving from outside that is frequency modulated in accordance with baseband signal amplitude, generating a change in oscillation frequency of the radiation type oscillator that is a same as a frequency change of the receive RF signal due to the oscillation frequency change, and obtaining a baseband signal amplitude from a change in bias of the three-electrode high-frequency amplifying device due to the oscillation frequency change.

A microwave/millimeter wave communication apparatus according to claim 2 is characterized in that it comprises the microwave/millimeter wave communication apparatus of claim 1, wherein the three electrodes of the three-electrode high-frequency amplifying device of the radiation type oscillator are a controlled-current entering electrode, a controlled-current exiting electrode, and a control electrode, a bias control circuit that varies bias in accordance with baseband signal amplitude is provided between a high-potential side of a direct current power source supply path and the controlled-current entering electrode, or between a low-potential side of a direct current power source supply path and the controlled-current exiting electrode, during transmission, modulation operation is performed by having the bias control circuit vary oscillation frequency of the radiation type oscillator, during reception, the bias control circuit is operated as an active load to form a baseband frequency band load of the three-electrode high-frequency amplifying device, and baseband signal amplitude is obtained from change in bias of the controlled-current entering electrode or controlled-current exiting electrode.

A microwave/millimeter wave communication apparatus according to claim 3 is characterized in that it comprises the microwave/millimeter wave communication apparatus of claim 1, wherein the three electrodes of the three-electrode high-frequency amplifying device of the radiation type oscillator are a controlled-current entering electrode, a controlled-current exiting electrode, and a control electrode, a baseband frequency band load is provided between a high-potential side of a direct current power source supply path and the controlled-current entering electrode, or between a low-potential side of a direct current power source supply path and the controlled-current exiting electrode, during transmission, modulation operation is performed by varying the control electrode bias in accordance with baseband signal amplitude to vary oscillation frequency of the radiation type oscillator, during reception, baseband signal amplitude is obtained from change in bias of the controlled-current entering electrode or controlled-current exiting electrode due to baseband frequency band load.

A microwave/millimeter wave communication apparatus according to claim 4 is characterized in that it comprises the microwave/millimeter wave communication apparatus of claim 1, wherein the three electrodes of the three-electrode high-frequency amplifying device of the radiation type oscillator are a controlled-current entering electrode, a controlled-current exiting electrode, and a control electrode, an impedance varying unit formed by an impedance varying device is provided at resonating cavities of the radiation type oscillator, a baseband frequency band load is provided between a high-potential side of a direct current power source supply path and the controlled-current entering electrode, or between a low-potential side of a direct current power source supply path and the controlled-current exiting electrode, during transmission, modulation operation is performed by varying oscillation frequency in accordance with baseband signal amplitude applied to the impedance varying device, during reception, baseband signal amplitude is obtained from change in bias of the controlled-current entering electrode or controlled-current exiting electrode due to baseband frequency band load.

In accordance with the invention of claim 1, a radiation type oscillator is formed by integrating a three-electrode high-frequency amplifying device to generate negative resistance at resonating cavities, and to share a function to emit an electromagnetic wave to space, wherein during transmission an oscillation frequency of the radiation type oscillator is varied in accordance with a baseband signal amplitude to frequency modulate a radiation wave as a transmit RF signal, and during reception demodulation operation is performed by the oscillation of the radiation type oscillator being injection-locked by a receive RF signal arriving from outside that is frequency modulated in accordance with baseband signal amplitude, generating a change in oscillation frequency of the radiation type oscillator that is a same as a frequency change of the receive RF signal due to the oscillation frequency change, and obtaining a baseband signal amplitude from a change in bias of the three-electrode high-frequency amplifying device due to the oscillation frequency change, enabling a microwave/millimeter wave communication apparatus to be realized having an extremely simple structure in which the transmission/reception antenna and frequency modulation/demodulation circuit based on injection-locking operation form an integrated whole.

Moreover, when quality control is considered, an extremely simple structure has the advantage of keeping down variations in characteristics, ensuring a high manufacturing yield, and is also advantageous for ensuring high reliability. A simple apparatus structure is very advantageous in terms of quality control particularly when manufacturing millimeter band apparatuses which requires precision, fine thin-film processing techniques. A very simple structure provides a high degree of design freedom and so is also advantageous in terms of restraining costs by reducing the number of steps in the design process. In addition, since the injection-locking operation ensures synchronization between transmitter and receiver, an oscillation circuit having a high degree of frequency stability is not needed, and it is not necessary to provide a separate frequency discriminator or suchlike demodulation circuit, making it ideal for lowering the cost.

Further, with no transmission loss on the feed line, it is low loss, high sensitivity, so high performance can be achieved with communication based on injection-locking operation, with high DC/RF conversion efficiency and low power consumption characteristics. Frequency capture range and lock range, and high-speed tracking and the like can be controlled by the shape of the resonating cavity, and with respect to synchronization performance, a degree of design freedom can be readily secured.

Based on the above advantages, the microwave/millimeter wave communication apparatus according to claim 1 can be effectively attained having a much simpler structure, lower cost, and lower power consumption than a communication apparatus with the same functions formed by the conventional technology.

Also, in accordance with the invention of claim 2, the three electrodes of the three-electrode high-frequency amplifying device of the radiation type oscillator are a controlled-current entering electrode, a controlled-current exiting electrode, and a control electrode, a bias control circuit that varies bias in accordance with baseband signal amplitude is provided between a high-potential side of a direct current power source supply path and the controlled-current entering electrode, or between a low-potential side of a direct current power source supply path and the controlled-current exiting electrode, during transmission, modulation operation is performed by having the bias control circuit vary oscillation frequency of the radiation type oscillator, during reception, the bias control circuit is operated as an active load to form a baseband frequency band load of the three-electrode high-frequency amplifying device, and baseband signal amplitude is obtained from change in bias of the controlled-current entering electrode or controlled-current exiting electrode, enabling the microwave/millimeter wave communication apparatus to be produced that is simple in structure and relatively cheap.

Also, in accordance with the invention of claim 3, the three electrodes of the three-electrode high-frequency amplifying device of the radiation type oscillator are a controlled-current entering electrode, a controlled-current exiting electrode, and a control electrode, a baseband frequency band load is provided between a high-potential side of a direct current power source supply path and the controlled-current entering electrode, or between a low-potential side of a direct current power source supply path and the controlled-current exiting electrode, during transmission, modulation operation is performed by varying the control electrode bias in accordance with baseband signal amplitude to vary oscillation frequency of the radiation type oscillator, during reception, baseband signal amplitude is obtained from change in bias of the controlled-current entering electrode or controlled-current exiting electrode due to baseband frequency band load, enabling a microwave/millimeter wave communication apparatus to be produced that is simple in structure and relatively cheap.

Also, in accordance with the invention of claim 4, the three electrodes of the three-electrode high-frequency amplifying device of the radiation type oscillator are a controlled-current entering electrode, a controlled-current exiting electrode, and a control electrode, an impedance varying unit formed by an impedance varying device is provided at resonating cavities of the radiation type oscillator, a baseband frequency band load is provided between a high-potential side of a direct current power source supply path and the controlled-current entering electrode, or between a low-potential side of a direct current power source supply path and the controlled-current exiting electrode, during transmission, modulation operation is performed by varying oscillation frequency in accordance with baseband signal amplitude applied to the impedance varying device, during reception, baseband signal amplitude is obtained from change in bias of the controlled-current entering electrode or controlled-current exiting electrode due to baseband frequency band load, making it possible to produce a microwave/millimeter wave communication apparatus that is simple in structure and relatively cheap, and in which there is little variation in the oscillation output power.

BRIEF DESCRIPTION OF THE DRAWINGS

FIGS. 19(*a*) and (*b*) are schematic diagrams of a sixth example structure of resonating cavities that can be applied to the present invention.

FIGS. 20(*a*) and (*b*) are schematic diagrams of a seventh example structure of resonating cavities that can be applied to the present invention.

BEST MODE FOR CARRYING OUT THE INVENTION

The following is a description of embodiments of the microwave/millimeter wave communication apparatus according to the present invention, made with reference to the accompanying drawings.

First Embodiment of the Microwave/Millimeter Wave Communication Apparatus

Figure 1A:
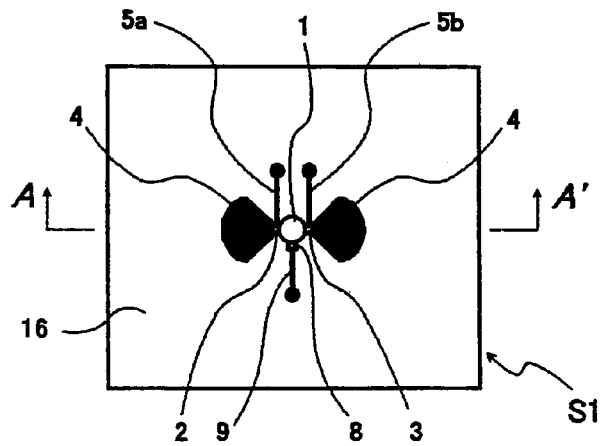
FIGS. 1(*a*), (*b*) and (*c*) are schematic diagrams of a microwave/millimeter wave communication apparatus according to a first embodiment of the present invention.
Figure 1B:
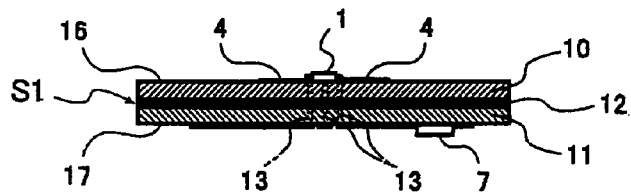
Figure 1C:
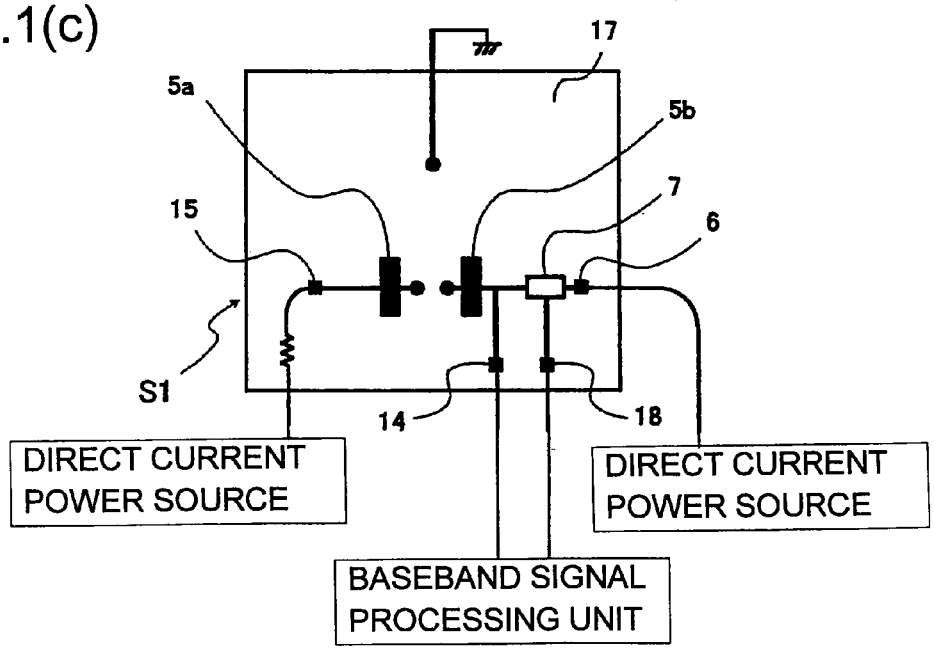
Figure 2:
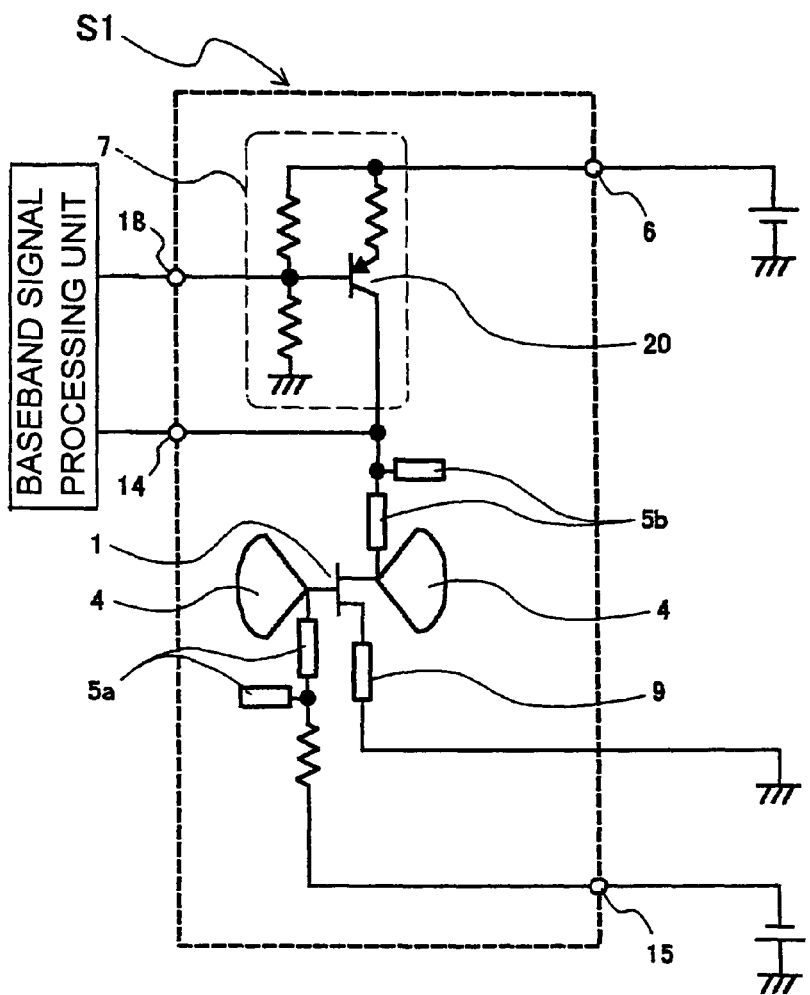
FIG. 2 is a diagram of the circuit structure of the microwave/millimeter wave communication apparatus according to the first embodiment.

FIG. 1 shows schematic configuration diagrams of a microwave/millimeter wave communication apparatus according to a first embodiment, in which FIG. 1(*a*) is a front view of a radiation type oscillator substrate S1, FIG. 1(*b*) is a cross-sectional view along line A-A' viewed toward the arrow in FIG. 1(*a*), and FIG. 1(*c*) is a rear view of the radiation type oscillator substrate S1. FIG. 2 is a schematic circuit diagram of the microwave/millimeter wave communication apparatus according to the first embodiment. The microwave/millimeter wave communication apparatus comprises the radiation type oscillator substrate S1, a power supply apparatus that feeds a direct-current bias thereto, and a baseband signal processing unit that supplies a baseband signal to the radiation type oscillator substrate S1, and acquires and appropriately signal-processes a baseband signal output from the radiation type oscillator substrate S1.

Here, the radiation type oscillator substrate S1 functions as "a radiation type oscillator formed by integrating a three-electrode high-frequency amplifying device to generate negative resistance at resonating cavities, and to share a function to emit an electromagnetic wave to space". The three-electrode high-frequency amplifying device is a device that realizes an amplification function by using a small voltage or current to control a large current, and includes a single transistor device or a device formed with a plurality of single transistors, and further includes not only parts that can be regarded as individual parts but also parts embedded in a semiconductor wafer through a semiconductor process. The control electrode in the three-electrode high-frequency amplifying device is an electrode that applies a controlled voltage and introduces (or removes) a controlled current, and is equivalent to a gate or base. The controlled-current entering electrode is an electrode into which the controlled current flows, and the controlled-current exiting electrode is an electrode from which the controlled current flows out; depending on whether the device structure is an N-type or P-type, one is equivalent to a drain or collector, and the other to a source or emitter.

On the radiation type oscillator substrate S1, a front surface layer 16, inner layer GND 12 and front surface side dielectric substrate 10 of the three-layer substrate form the RF circuit unit of the radiation type oscillator, and the inner layer GND 12, rear surface layer 17 and rear surface side dielectric substrate 11 form part of an RF choke circuit, and a baseband circuit.

A pair of conductor patches 4 and 4 is provided axially symmetrically on the side of the front surface of the front surface side dielectric substrate 10 to form a radiation face, a gate 2 as the control electrode and a drain 3 as the controlled-current entering electrode of a high-frequency transistor 1 as the three-electrode high-frequency amplifying device placed between the pair of conductor patches 4 and 4 are connected to the conductor patches 4 and 4, respectively, and an RF choke circuit 5*a* for supplying a gate direct-current bias is connected to the gate 2. Power from a direct current power source that is not shown is supplied to the RF choke circuit 5*a* via a direct-current gate voltage supply terminal 15. The conductor patch 4 and an RF choke circuit 5*b* for supplying a drain bias are connected to the drain 3. A bias control circuit 7 is connected in series between the RF choke circuit 5*b* and the direct-current drain voltage supply terminal 6. A baseband signal input terminal 18 is connected to the bias control circuit 7. A baseband signal output terminal 14 is connected between the drain-side RF choke circuit and the bias control circuit 7. A source 8 as the controlled-current exiting electrode is grounded via a line 9 having an impedance that satisfies an oscillation condition. The transistor 1, conductor patches 4 and 4, parts of the RF choke circuits and line 9 are formed on the front surface layer 16 (RF radiation side surface). The remaining parts of the RF choke circuits and the bias control circuit 7 are formed in the rear surface layer 17. The RF choke circuits include through-hole portions 13.

Here, the conductor patches 4 and 4 function as resonators, transmission antennas, and reception antennas, and are also part of resonating cavities that form a feedback circuit. The radiation type oscillator that generates and emits transmit RF signals of wavelength A is realized by setting the areas and shapes of the conductor patches 4 and 4 and supplying a direct current to the above high-frequency transistor. Moreover, the high-frequency transistor 1 is a three-electrode high-frequency amplifying device having a negative resistance.

Figure 3:
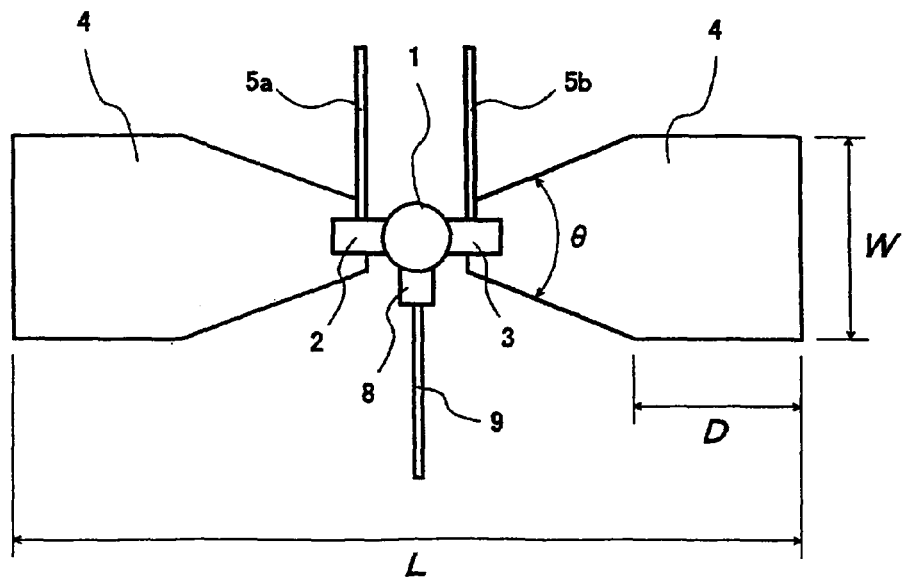
FIG. 3 illustrates a structures of conductor patches and a microwave transistor in a radiation type oscillator.

FIG. 3 shows a pair of the axially symmetrical conductor patches 4 and 4. Each of the conductor patches 4 and 4 has a peaked portion with uniform inclination angles that is connected to the gate 2 or the drain 3 of the high-frequency transistor 1. The peaked portions are placed in proximity to each other. Going via the peaked portions, the length of each parallel portion having a width W is taken as D, and the overall length of the conductor patches 4 and 4 from the end of one to the end of the other (total length) is taken as L.

In the conductor patches 4 and 4 thus structured, the coupling strength between the high-frequency transistor 1 and the resonators can be adjusted by adjusting the spread angle A of the peaked portion connected to the gate 2 or the drain 3 of the high-frequency transistor 1. Also, a degree of freedom in selecting various conditions required for setting oscillation conditions can be obtained by appropriately selecting the total length L, the width W and the parallel portion length D. Also, while not shown, a stable oscillation state can be secured by setting the distance h between the conductor patch 4 and the inner layer GND 12 (substantially the thickness of the front surface side dielectric substrate 10) in the range of $1/15$ to $1/5$ of the oscillation wavelength $\lambda$. The structures of the conductor patches 4 and 4 are not particularly limited, and may be any structure as long as resonating cavities suitable for oscillation RF signals can be formed with the front surface side dielectric substrate 10 and inner layer GND 12. Examples of modifications of the resonating cavities are described later.

The bias control circuit 7 can control the drain bias of the high-frequency transistor 1 in accordance with the signal input to the baseband signal input terminal 18. In this embodiment, the bias control circuit 7 used a transistor 20 (see FIG. 2). The transistor 20 does not have to be a transistor that operates in the microwave band/millimeter wave band. In this embodiment, a general-purpose bipolar transistor was used that operates at the baseband frequency band. It is also not necessary for the bias control circuit 7 to be a circuit based on a single transistor, and may instead be an integrated circuit that uses a plurality of transistors.

To operate the radiation type oscillator substrate S1 configured as described in the above, a direct current power source is connected to each of the direct-current gate voltage supply terminal 15 and direct-current drain voltage supply terminal 6, a baseband signal processing unit is connected to the baseband signal input terminal 18, and a suitable voltage for starting the radiation type oscillation is supplied to each terminal. If a self-bias or the like is used to set a gate bias, there is no need for a direct current power source to supply a gate direct-current bias.

The transmission operation in the microwave/millimeter wave communication apparatus according to this embodiment will now be described. The collector current of the transistor 20 forming the bias control circuit 7 varies in accordance with a baseband transmission signal input from the baseband signal input terminal 18, which is to say, the drain bias of the high-frequency transistor 1 varies, whereby frequency modulation is realized by the changing of the oscillation frequency, and the transmission operation is performed by the radiation wave forming the transmit RF signal. This frequency modulation operation varies the drain bias value of the high-frequency transistor 1 in accordance with the baseband signal amplitude, and utilizes the bias dependence of the capacitance component or induction component of the transistor to change the resonance frequency of the resonating cavities, changing the oscillation frequency.

The reception operation of the microwave/millimeter wave communication apparatus according to this embodiment will now be described. A reception operation is performed by synchronizing the oscillation signal of the apparatus with a frequency-modulated receive RF signal that arrives from outside, generating the frequency change due to the frequency modulation as a change in the drain bias of the high-frequency transistor 1, and taking off the change from the baseband signal output terminal 14 as a voltage amplification change. At this time, the bias control circuit 7 is made to operate as an active load. It can be operated as an active load (constant-current circuit) by maintaining a constant bias state so that a constant collector current flows to the transistor 20 that forms the bias control circuit 7. In the case of this embodiment, the bias control circuit 7 can be made to function as an active load by setting a constant potential without allowing the potential of the baseband signal input terminal 18 to be changed.

Next, transmission/reception operations in a case in which two of the microwave/millimeter wave communication apparatuses according to this embodiment are used in opposition to effect communication will be described in detail.

First, taking the baseband signal input to the microwave/millimeter wave communication apparatus on the transmission side as a square wave digital signal, V1 is the voltage when "0 (Lo)", and V2 is the voltage when "1 (Hi)". FSK (frequency shift keying) modulation operation is effected with f1 as the oscillation frequency when "0", and f2 as the oscillation frequency when "1". Thereby, a signal of frequency f1 or f2 is radiated as the transmit RF signal.

On the other hand, the oscillation of the microwave/millimeter wave communication apparatus on the reception side is synchronized with that, so oscillation operations are performed at the f1 or f2 frequency. In the apparatus on the receiving side, a difference in the drain bias of the high-frequency transistor is generated during oscillation at f1 and during oscillation at f2. If V1' and V2' are the respective bias voltages, V1' corresponds to "0" and V2' to "1". Thereby, baseband signal information transmission is realized, and if the desired voltage changes are obtained from the changes in the drain bias, the digital signal square wave is demodulated. This demodulation operation is the function of converting frequency changes to amplitude changes; generally a frequency discriminator function.

For the purpose of this explanation, FSK has been used as the modulation system example. However, a similar operation can be used with analog modulation such as audio FM to transmit information. Also, a baseband signal is an ordinary digital data signal or analog audio signal or the like, not a modulated IF signal (intermediate frequency signal). For example, a square wave digital signal and the like in which "0" is −0.5 [V] and "1" is +1.0 [V] corresponds to a baseband signal.

Figure 4:
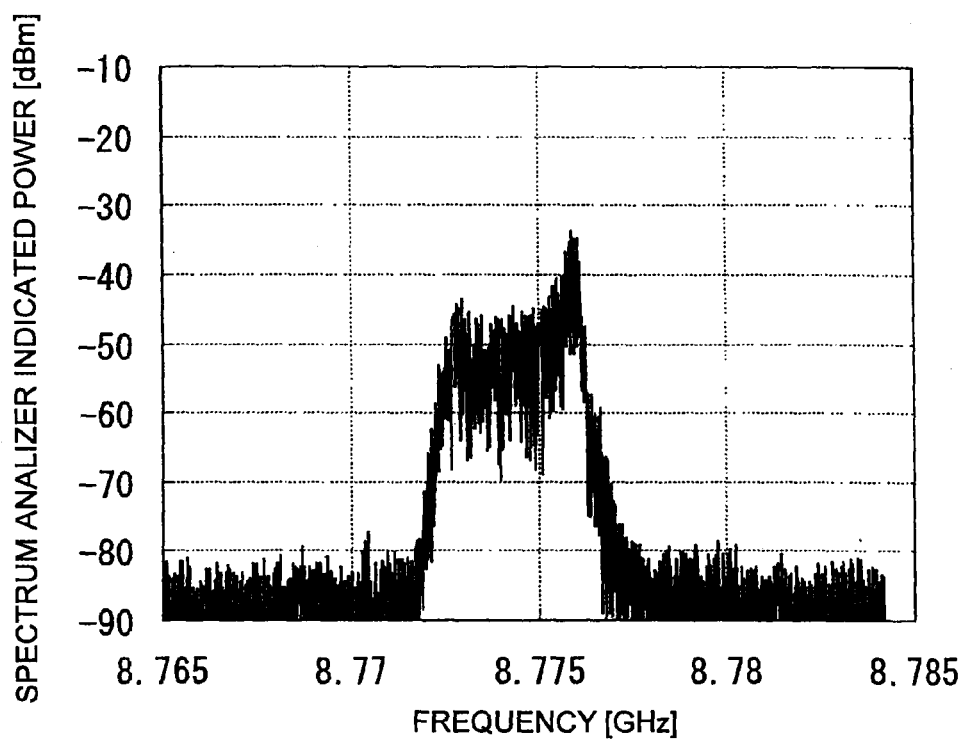
FIG. 4 shows a spectrum of an RF radiation signal frequency modulated by the microwave/millimeter wave communication apparatus in an injection-locked state.
Figure 5:
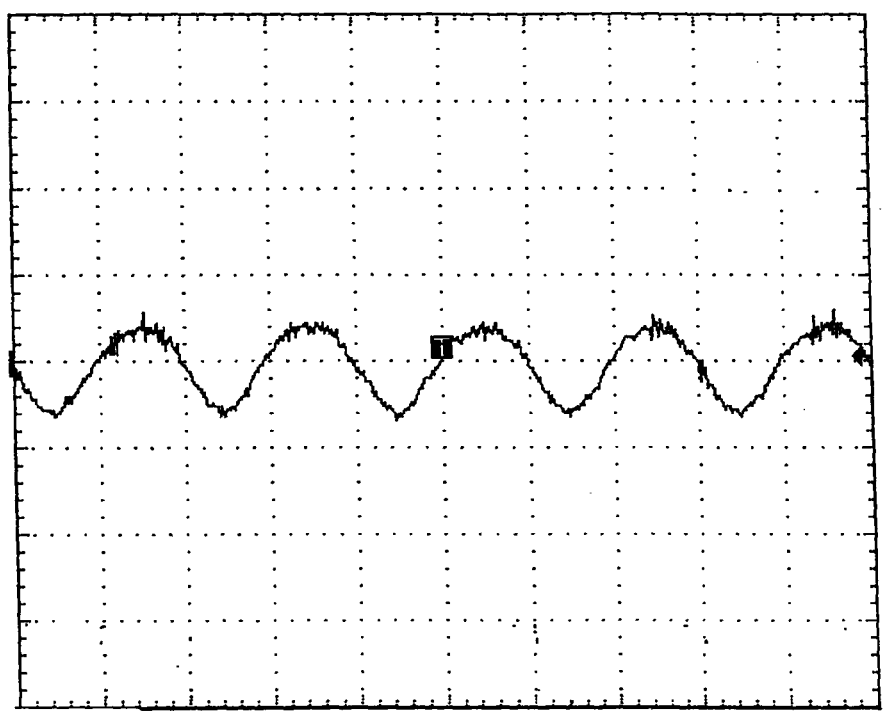
FIG. 5 is a diagram of the time waveform of a baseband signal demodulated by the microwave/millimeter wave communication apparatus.
Figure 6:
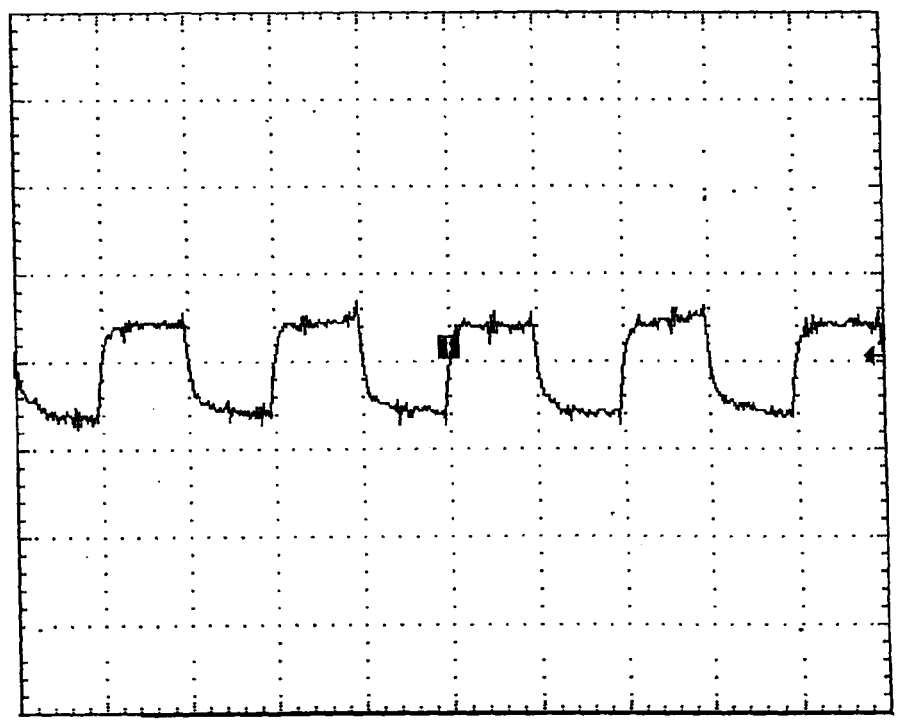
FIG. 6 is a diagram of the time waveform of a 100 kHz square wave baseband signal restored by the microwave/millimeter wave communication apparatus.

FIGS. 4, 5 and 6 show the results of actual communication tests carried out using two microwave/millimeter wave communication apparatuses according to this embodiment. FIG. 4 shows the spectrum of an RF radiation signal frequency modulated by the microwave/millimeter wave communication apparatus in an injection-locked state. FIG. 5 is a diagram of the time waveform of a baseband signal demodulated by the apparatus. The baseband transmission signal input to the communication apparatus on the transmission side is a 100 kHz sine wave, the RF oscillation frequency is about 8.775 GHz and the frequency shift is about 40 MHz. The oscillation by the apparatus is a free-running operation. There is no special inclusion of a frequency stabilization circuit such as a phase-locked loop or the like. As shown in FIG. 5, the 100 kHz sine wave baseband signal is restored. The baseband signal is not limited to a sine wave, and a square wave or triangular wave or the like may be similarly restored. FIG. 6 is the time waveform of a restored baseband signal in the case of a 100 kHz square wave.

In this way, the microwave/millimeter wave communication apparatus according to this embodiment has an extremely simple structure in which the transmission/reception antenna, oscillation circuit, and frequency modulation/demodulation circuit based on injection-locking operation form an integrated whole, so with no transmission loss on the power supply line, it is a structure with low power consumption and high-efficiency radiation characteristics, that is, high-efficiency reception characteristics, facilitating injection-locking. There is no need to separately provide a demodulator such as a frequency discriminator or the like, and no need for a high frequency stability oscillation circuit such as a phase-locked loop. Thus, through these synergistic effects, a microwave/millimeter wave communication apparatus can be realized that is much simpler, lower cost and lower power consumption than a communication apparatus with the same functions formed using the conventional technology.

In particular, in the microwave/millimeter wave communication apparatus according to this embodiment, the bias control circuit 7 that varies the bias in accordance with the baseband signal amplitude is provided between the high-potential side of the direct current power source supply path and the controlled-current entering electrode that is the drain, during transmission modulation operation is performed by having the bias control circuit 7 vary the oscillation frequency of the radiation type oscillator, during reception the bias control circuit 7 is operated as an active load to form the baseband frequency band load of the high-frequency transistor 1, and the baseband signal amplitude is obtained from the change in bias of the controlled-current entering electrode, which has the advantage of enabling the microwave/millimeter wave communication apparatus to be produced that is simple in structure and relatively cheap.

Figure 7:
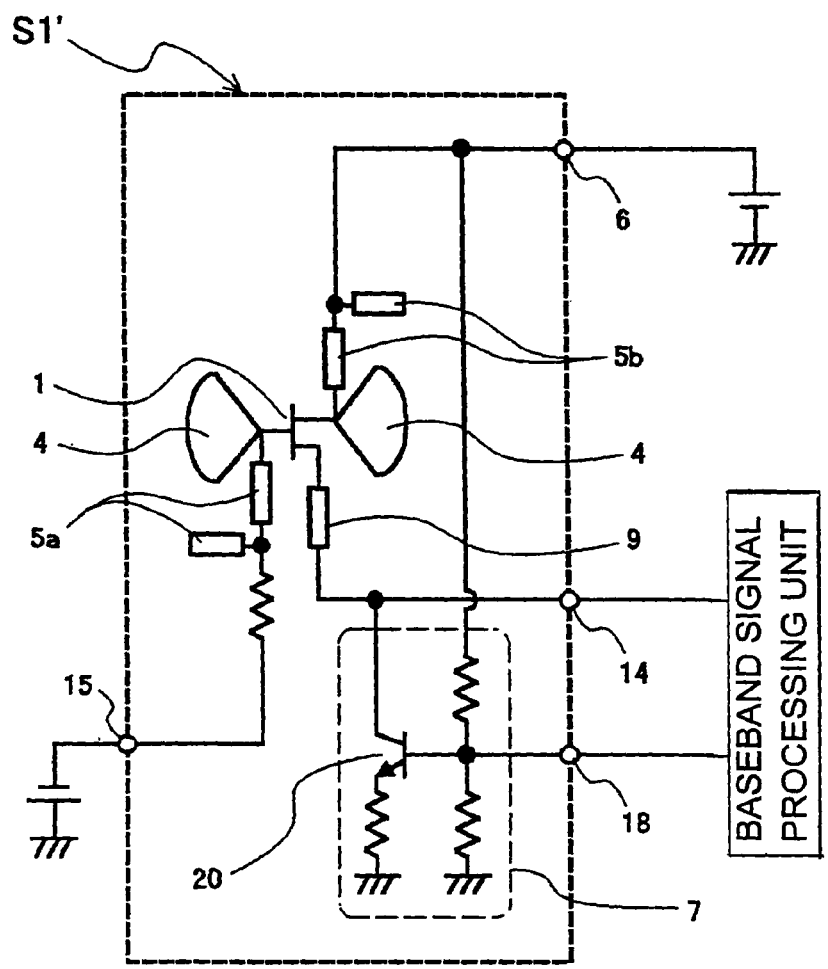
FIG. 7 is a diagram of another circuit structure of the microwave/millimeter wave communication apparatus according to the first embodiment.

As in the radiation type oscillator substrate S1' shown in FIG. 7, the bias control circuit 7 may be provided between the low-potential side of a direct current power source supply path and the controlled-current exiting electrode that is the source. That is because the current input to the drain and the current output from the source are almost the same, so the same modulation/demodulation operation can be realized both when the bias control circuit 7 is provided between the high-potential side of the direct current power source supply path and the source to apply source bias changes and obtain changes, and when the bias control circuit 7 is provided between the low-potential side of the direct current power source supply path and the drain to apply drain bias changes and obtain changes. When the bias control circuit 7 is provided between the low-potential side of the direct current power source supply path and the drain, the line 9 may be changed to a circuit similar to the RF choke circuit 5a or RF choke circuit 5b or the like if needed due to leakage of the RF signal from the line 9 to the baseband signal processing unit.

Second Embodiment of the Microwave/Millimeter Wave Communication Apparatus

Figure 8A:
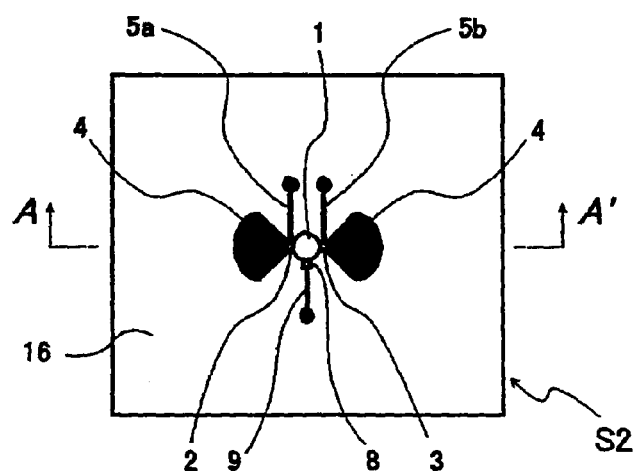
FIGS. 8(*a*), (*b*) and (*c*) are schematic diagrams of a microwave/millimeter wave communication apparatus according to a second embodiment.
Figure 8B:
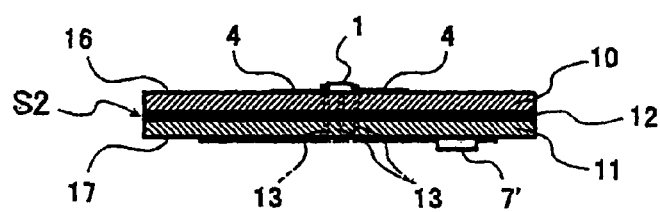
Figure 8C:
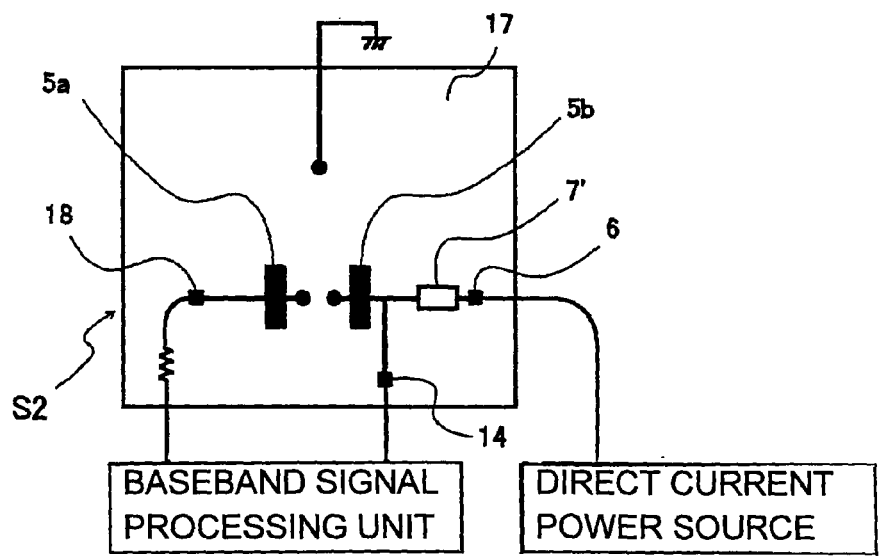
Figure 9:
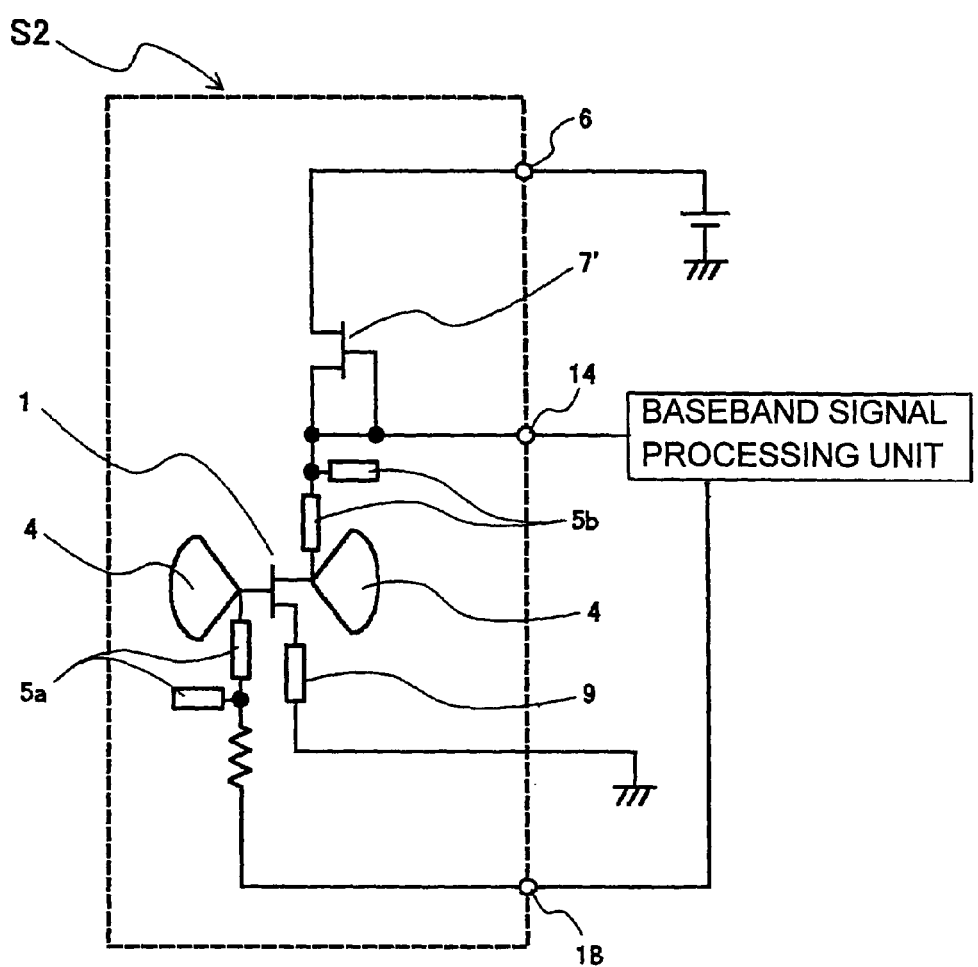
FIG. 9 is a diagram of the circuit structure of the microwave/millimeter wave communication apparatus according to the second embodiment.

Next, the microwave/millimeter wave communication apparatus according to a second embodiment will be described with reference to FIGS. 8 and 9. FIG. 8 shows the schematic configuration of the microwave/millimeter wave communication apparatus according to the second embodiment, in which FIG. 8(a) is a front view of a radiation type oscillator substrate S2, FIG. 8(b) is a cross-sectional view along line A-A' viewed toward the arrow in FIG. 8(a), and FIG. 8(c) is a rear view of the radiation type oscillator substrate S2. FIG. 9 is a schematic circuit diagram of the microwave/millimeter wave communication apparatus according to the second embodiment.

The microwave/millimeter wave communication apparatus comprises the radiation type oscillator substrate S2, a power supply apparatus that feeds a direct-current bias thereto, and a baseband signal processing unit that supplies a baseband signal to the radiation type oscillator substrate S2, and acquires and appropriately signal-processes a baseband signal output from the radiation type oscillator substrate S2. In the microwave/millimeter wave communication apparatus according to this embodiment, the baseband signal input position used in the above-described first embodiment of the microwave/millimeter wave communication apparatus has been changed. Structures that are the same as those shown in the microwave/millimeter wave communication apparatus of the first embodiment have been given the same reference symbols, and the description thereof is omitted.

In the radiation type oscillator substrate S2, baseband signal input terminal 18 is connected to gate 2 of the high-frequency transistor 1. Also, bias control circuit 7' is connected in series between the RF choke circuit 5b and the direct-current drain voltage supply terminal 6 as a baseband frequency band load.

While in the above-described microwave/millimeter wave communication apparatus of the first embodiment the drain bias of the high-frequency transistor 1 is changed by the modulation operation, in the microwave/millimeter wave communication apparatus according to this embodiment, the modulation operation is carried out by the changing of the gate bias. Frequency modulation is realized by the changing of the drain bias changing the oscillation frequency, with the radiation wave forming the transmit RF signal. This frequency modulation operation varies the gate bias value of the high-frequency transistor 1 in accordance with the baseband signal amplitude, and utilizes the bias dependence of the capacitance component or induction component of the transistor to change the resonance frequency of the resonating cavities, changing the oscillation frequency.

The demodulation operation of the microwave/millimeter wave communication apparatus according to this embodiment is the same as that of the microwave/millimeter wave communication apparatus of the first embodiment, but as there is no need to vary the drain bias, there is no need to provide a bias control circuit 7 as in the microwave/millimeter wave communication apparatus of the first embodiment, as only a load needs to be provided on the drain side of the high-frequency transistor. In this embodiment, therefore, as shown in FIG. 9, an active load circuit 7' that utilizes the Idss of a junction type field effect transistor is provided.

A passive device such as a resistance or coil or the like that functions in the baseband frequency band may be used as the baseband frequency band load in place of the active load circuit 7'. However, when a resistance having a high resistance value is used as a load, the resistance causes a large drop in voltage and the power consumed in the resistance becomes overwhelming, making it impossible to utilize the low power consumption characteristics that are a feature of the communication apparatus of the present invention. In order to obtain a high baseband signal voltage while avoiding the increase in power consumption caused by the above high resistance, it is desirable to provide between the drain side RF choke and the direct current power source, an active load circuit having a lower voltage drop than the resistance, and utilize that high impedance as a load.

In this way, the microwave/millimeter wave communication apparatus according to the second embodiment has an extremely simple structure in which the transmission/reception antenna, oscillation circuit, and frequency modulation/demodulation circuit based on injection-locking operation form an integrated whole, so with no transmission loss on the power supply line, it is a structure with low power consumption and high-efficiency radiation characteristics, that is, high-efficiency reception characteristics, facilitating injection-locking. There is no need to separately provide a demodulator such as a frequency discriminator or the like, and no need for a high frequency stability oscillation circuit such as a phase-locked loop. Thus, through these synergistic effects, a microwave/millimeter wave communication apparatus can be realized that is much simpler, lower cost and lower power consumption than a communication apparatus with the same functions formed using the conventional technology.

In particular, in the microwave/millimeter wave communication apparatus according to this embodiment, the active load circuit 7' that is the baseband frequency band load is provided between the high-potential side of the direct current power source supply path and the controlled-current entering electrode, during transmission, the modulation operation that varies the oscillation frequency of the radiation type oscillator is performed by varying the bias of the gate that is the control electrode, and during reception, the baseband signal amplitude is obtained from the change in the bias of the drain due to the active load circuit 7', which has the advantage of enabling the microwave/millimeter wave communication apparatus to be produced that is simple in structure and relatively cheap.

Figure 10:
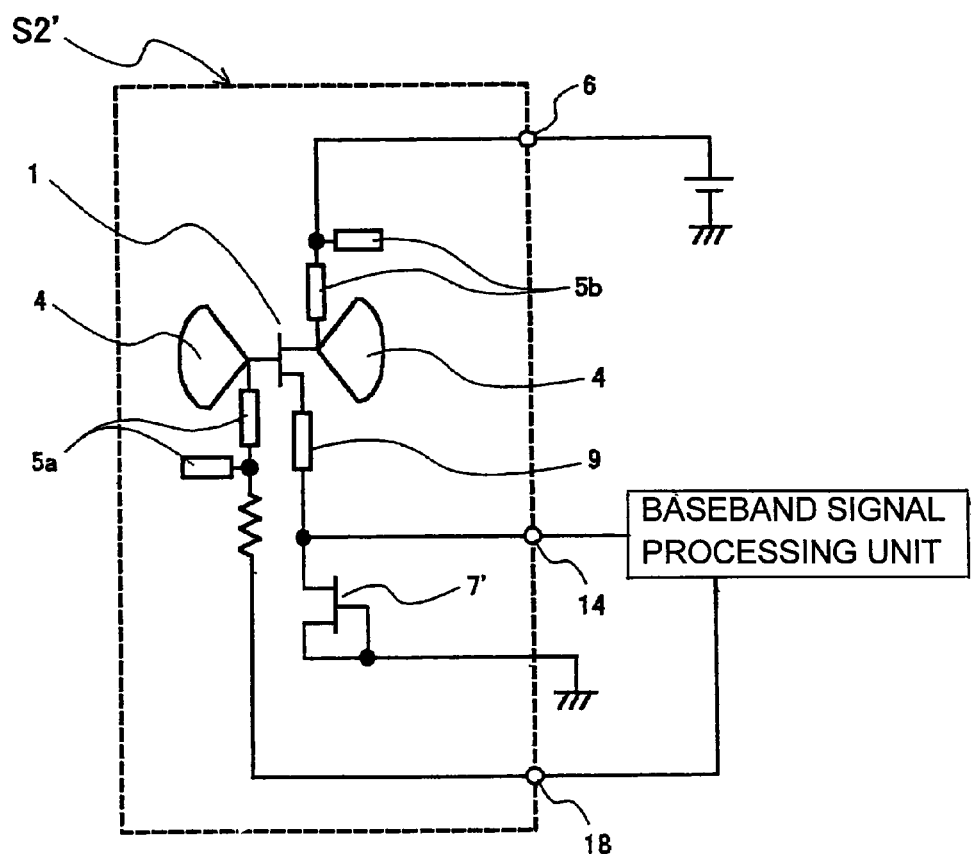
FIG. 10 is a diagram of another circuit structure of the microwave/millimeter wave communication apparatus according to the second embodiment.

As in the radiation type oscillator substrate S2' shown in FIG. 10, the active load circuit 7' that is the baseband frequency band load may be provided between the low-potential side of the direct current power source supply path and the controlled-current exiting electrode that is the source. That is because the current input to the drain and the current output from the source are almost the same, so the same modulation/demodulation operation can be realized both when the active load circuit 7' is provided between the high-potential side of the direct current power source supply path and the source to apply source bias changes and obtain changes, and when the active load circuit 7' is provided between the low-potential side of the direct current power source supply path and the drain to apply drain bias changes and obtain changes. When the active load circuit 7' is provided between the low-potential side of the direct current power source supply path and the drain, the line 9 may be changed to a circuit similar to the RF choke circuit 5a or RF choke circuit 5b or the like if needed due to leakage of the RF signal from the line 9 to the baseband signal processing unit.

Third Embodiment of the Microwave/Millimeter Wave Communication Apparatus

Figure 11A:
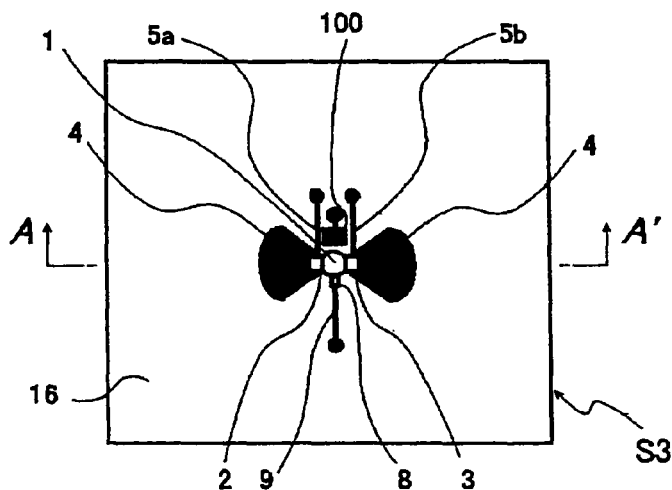
FIGS. 11(*a*), (*b*) and (*c*) are schematic diagrams of a microwave/millimeter wave communication apparatus according to a third embodiment.
Figure 11B:
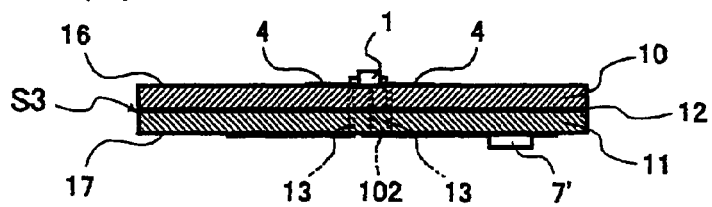
Figure 11C:
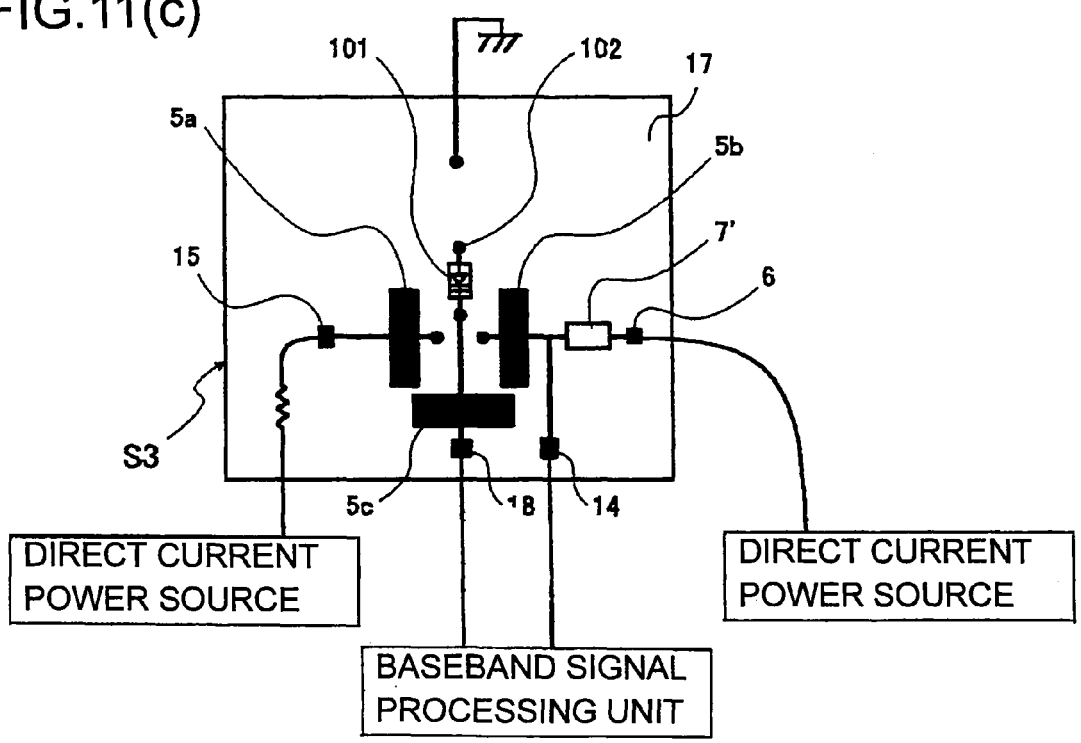

Next, the microwave/millimeter wave communication apparatus according to a third embodiment will be described with reference to FIGS. 11 and 12. FIG. 11 shows the schematic configuration of the microwave/millimeter wave communication apparatus according to the third embodiment, in which FIG. 11(*a*) is a front view of a radiation type oscillator substrate S3, FIG. 11(*b*) is a cross-sectional view along line A-A' viewed toward the arrow in FIG. 11(*a*), and FIG. 11(*c*) is a rear view of the radiation type oscillator substrate S3.

Figure 12:
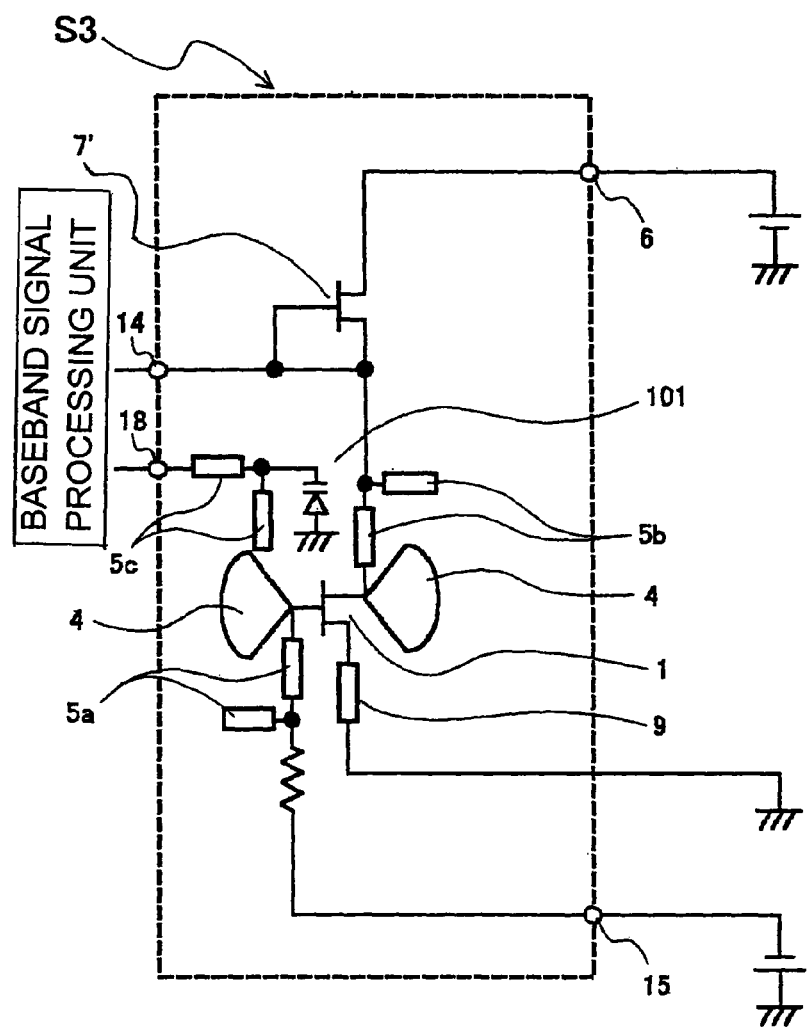
FIG. 12 is a diagram of the circuit structure of the microwave/millimeter wave communication apparatus according to the third embodiment.

FIG. 12 is a schematic circuit diagram of the microwave/millimeter wave communication apparatus according to the third embodiment.

The microwave/millimeter wave communication apparatus comprises the radiation type oscillator substrate S3, a power supply apparatus that feeds a direct-current bias thereto, and a baseband signal processing unit that supplies a baseband signal to the radiation type oscillator substrate S3, and acquires and appropriately signal-processes a baseband signal output from the radiation type oscillator substrate S3. While in the microwave/millimeter wave communication apparatuses of the first and second embodiments described above, the bias of the high-frequency transistor 1 is changed by the baseband signal to effect frequency modulation, in the microwave/millimeter wave communication apparatus according to this embodiment, frequency modulation is performed by the impedance of an impedance varying unit provided at resonating cavities of the radiation type oscillator being varied according to the baseband signal. Structures that are the same as those shown in the microwave/millimeter wave communication apparatus of the first embodiment have been given the same reference symbols, and the description thereof is omitted.

A conductor pattern 100 that is sufficiently smaller in size than the wavelength and does not resonate with the oscillation signals is provided in the vicinity of the conductor patches 4 and 4, and a varactor diode 101 (capacitance varying diode) as a impedance varying device is connected to the conductor pattern 100. The conducting pattern 100 and the varactor diode 101 form the impedance varying unit. The conductor pattern 100 is not necessarily provided on the same layer (same face) of the conductor patches 4 and 4 on the substrate, and may be provided on the inner layer. The cathode of the varactor diode 101 is connected to the conductor pattern 100, and the anode to the inner layer GND 12 via through-hole 102. The baseband signal to be applied to the varactor diode 101 is input from a baseband signal input terminal 18 to the cathode via an RF choke circuit 5c.

Resonating cavities that determine the oscillation frequency of the microwave/millimeter wave communication apparatus according to this embodiment are formed by the inner layer GND 12, the thickness of the front surface side dielectric substrate 10, and the conductor patches 4 and 4. Since the electromagnetic fields of oscillation signals concentrate in the vicinity of the conductor patches 4 and 4 of the front surface side dielectric substrate 10, the impedance varying unit is provided in the vicinity of the conductor patches 4 and 4, and the oscillation frequency is varied by changing the impedance. Even if the conductor pattern 100 is not made sufficiently small in size compared to the oscillation wavelength, but around the same, frequency modulation can still be performed without a problem. However, in this embodiment, a conductor pattern 100 is provided that is of a size that is sufficiently small compared to the wavelength so as to not affect the radiation directivity. The impedance varying device used to form the impedance varying unit is not limited to a capacitance varying device, and may be a variable inductance device.

In this way, the microwave/millimeter wave communication apparatus according to this embodiment has an extremely simple structure in which the transmission/reception antenna, oscillation circuit, and frequency modulation/demodulation circuit based on injection-locking operation form an integrated whole, so with no transmission loss on the power supply line, it is a structure with low power consumption and high-efficiency radiation characteristics, that is, high-efficiency reception characteristics, facilitating injection-locking. There is no need to separately provide a demodulator such as a frequency discriminator or the like, and no need for a high frequency stability oscillation circuit such as a phase-locked loop. Thus, through these synergistic effects, a microwave/millimeter wave communication apparatus can be realized that is much simpler, lower cost and lower power consumption than a communication apparatus with the same functions formed using the conventional technology.

In particular, in the microwave/millimeter wave communication apparatus according to this embodiment, the resonating cavity of the radiation type oscillator is provided with the varactor diode 101 as an impedance varying device to form an impedance varying unit, the active load circuit 7' that is the baseband frequency band load is provided between the high-potential side of the direct current power source supply path and the drain that is the controlled-current entering electrode, during transmission, the modulation operation that varies the oscillation frequency of the radiation type oscillator is performed in accordance with the baseband signal amplitude applied to the varactor diode 101, and during reception, the baseband signal amplitude is obtained from the variation in the bias of the drain due to the active load circuit 7', which has the advantage of enabling the microwave/millimeter wave communication apparatus to be produced that is simple in structure and relatively cheap.

Figure 13:
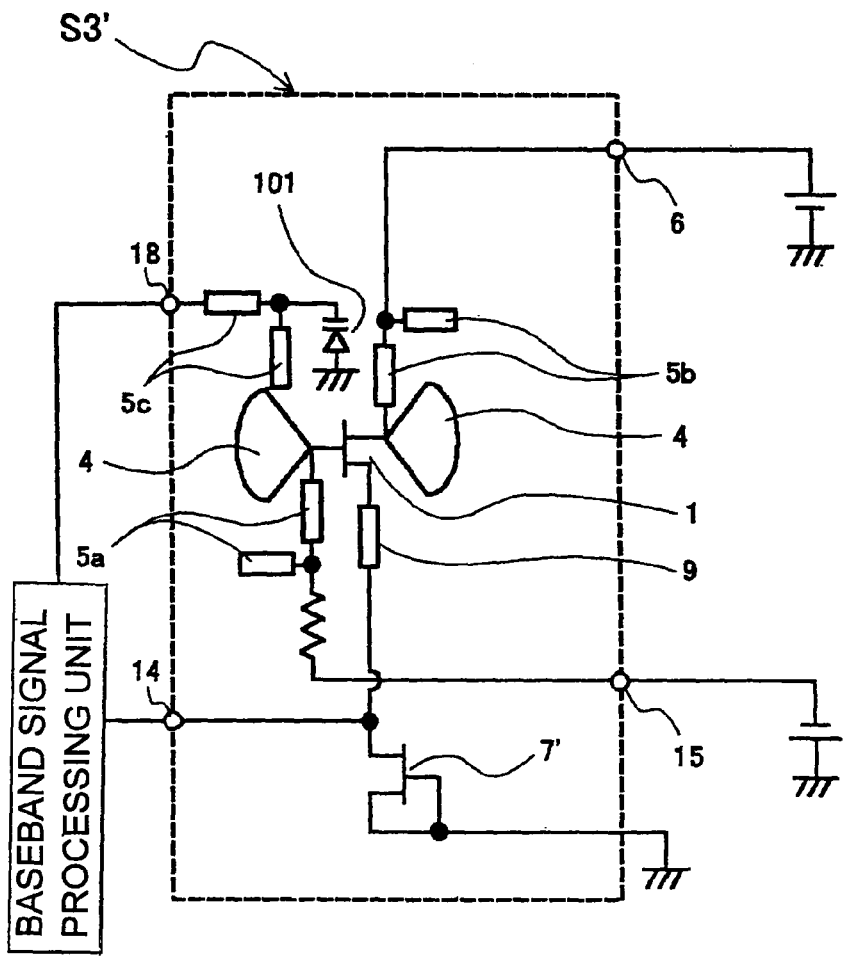
FIG. 13 is a diagram of another circuit structure of the microwave/millimeter wave communication apparatus according to the third embodiment.

As in the radiation type oscillator substrate S3' shown in FIG. 13, the active load circuit 7' that is the baseband frequency band load may be provided between the low-potential side of the direct current power source supply path and the controlled-current exiting electrode that is the source. That is because the current input to the drain and the current output from the source are almost the same, so the same modulation/demodulation operation can be realized both when the active load circuit 7' is provided between the high-potential side of the direct current power source supply path and the source to apply source bias changes and obtain changes, and when the active load circuit 7' is provided between the low-potential side of the direct current power source supply path and the drain to apply drain bias changes and obtain changes. When the active load circuit 7' is provided between the low-potential side of the direct current power source supply path and the drain, the line 9 may be changed to a circuit similar to the RF choke circuit 5*a* or RF choke circuit 5*b* or the like if needed due to leakage of the RF signal from the line 9 to the baseband signal processing unit.

Microwave/millimeter wave communication apparatuses based on the first to third embodiments have been described in the foregoing, in which the modulation operations thereof are premised on the oscillation of the communication apparatuses being injection-locked by frequency-modulated RF signals that arrive from outside. If it is assumed that synchronization is not done, and the frequency of the arriving RF signal and the oscillation frequency are different, an IF signal can be obtained without being able to obtain a baseband signal. This case in which there is no synchronization between transmission and reception means that the communication apparatuses are functioning merely as down-conversion mixers, so that to obtain a baseband signal from the IF signal would require a separate frequency discriminator or the like as a demodulation function, and a high degree of oscillation stability. Since injection-locking based demodulation operation is possible with the microwave/millimeter wave communication apparatus according to this embodiment, "a radiation type oscillator formed by integrating a three-electrode high-frequency amplifying device to generate negative resistance at resonating cavities, and to share a function to emit an electromagnetic wave to space" itself has a frequency discriminator function.

In the microwave/millimeter wave communication apparatus according to each of the above-described embodiments, also, the type of high-frequency transistor 1 used as the three-electrode high-frequency amplifying device to form the radiation type oscillator is not particularly limited as long as it possesses the amplification function of controlling a large current with a small voltage or current, such as an IG-FET (Insulated Gate FET) including a MOS-FET, a HEMT (High Electron Mobility Transistor), a MESFET (Metal-Semiconductor FET) or other such field effect transistor (FET), or a bipolar junction transistor (BJT) such as a HBT (Heterojunction Bipolar Transistor).

There is also no particular limitation on the internal structure of the three-electrode high-frequency amplifying device, which may be a device having a structure comprised of an assembly of a plurality of single transistors such as Darlington connection transistors and cascade connection transistors. Using Darlington connection transistors, for example, would bring the advantage of being able to obtain a high current amplification factor that cannot be realized with single transistors.

The microwave/millimeter wave communication apparatus according to each of the above-described embodiments may also be realized by a HMIC (Hybrid Microwave Integrated Circuit), or a MMIC (Monolithic Microwave Integrated Circuit). It may also be realized by a three-dimensional integrated circuit using LTCC (Low Temperature Co-fired Ceramics) or the like. That is, as in the radiation type oscillator substrates S1 to S3 of the first to third embodiments, independent parts such as the high-frequency transistor 1 do not have to be mounted on the substrate, and the three-electrode high-frequency amplifying device may be monolithically embedded in a semiconductor wafer by the same semiconductor process, along with the resonating cavities (conductor patches, etc.). In particular, millimeter wave band wavelengths are short, so the size of the resonating cavities can be decreased, so embedding the three-electrode high-frequency amplifying device in a monolithic form (MMIC) would have the advantage of helping to further decrease the size and weight, making it possible to achieve high productivity with higher quality by using high-precision semiconductor process technology.

The function of the RF choke circuits in the microwave/millimeter wave communication apparatus according to each of the above-described embodiments is to prevent RF signals from leaking towards the direct current power source side, but even if RF signals do leak towards the direct current power source, the radiation type oscillator can still operate as long as the negative resistance obtained by means of the high-frequency transistor 1 is higher than the loss caused by the leakage. Accordingly, the microwave/millimeter wave communication apparatus can still be realized even when the invention is formed with a radiation type oscillator that is not provided with an RF choke circuit. Also, it is not necessary to use a radiation type oscillator substrate having a three-layer substrate structure to form an RF choke circuit.

Also, although in the microwave/millimeter wave communication apparatus according to each of the above-described embodiments, a pair of roughly fan-shaped conductor patches 4 and 4 is provided on the radiation type oscillator substrate, there is no particular limitation on the shape of the conductor patches forming the resonating cavities, nor is a pair of axially symmetrical conductor patches essential.

Examples of modifications of the resonating cavities that can be applied to the present invention are described below.

Figure 14A:
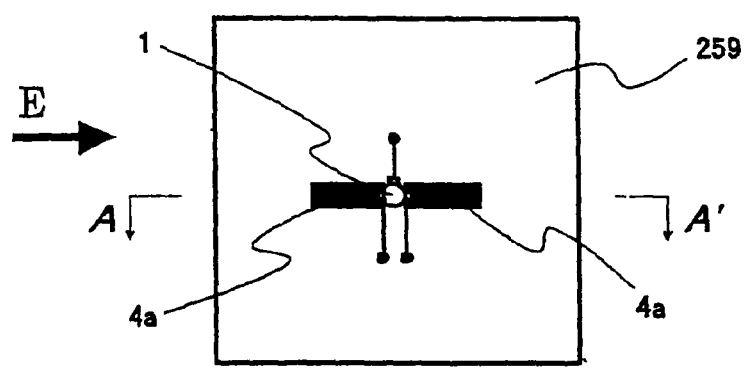
FIGS. 14(*a*) and (*b*) are schematic diagrams of a first example structure of resonating cavities that can be applied to the present invention.
Figure 14B:
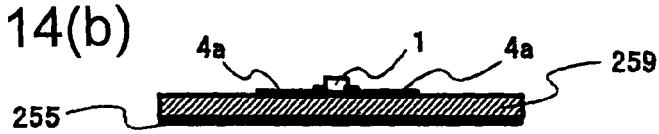
Figure 15A:
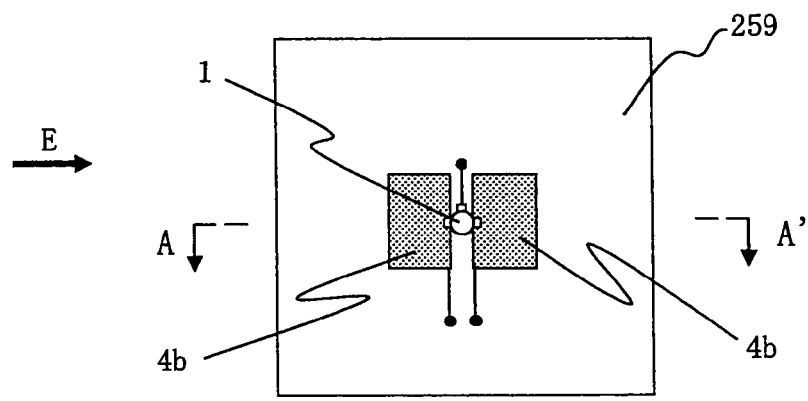
FIGS. 15(*a*) and (*b*) are schematic diagrams of a second example structure of resonating cavities that can be applied to the present invention.
Figure 15B:
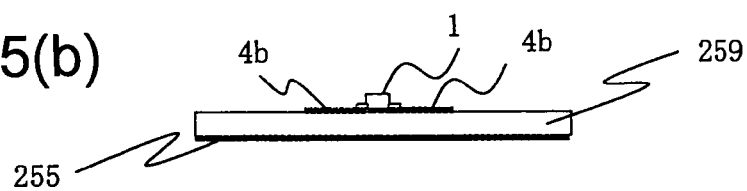
Figure 16A:
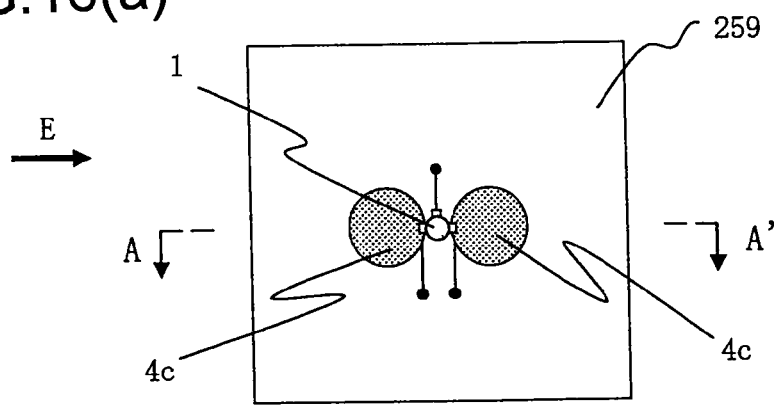
FIGS. 16(*a*) and (*b*) are schematic diagrams of a third example structure of resonating cavities that can be applied to the present invention.
Figure 16B:
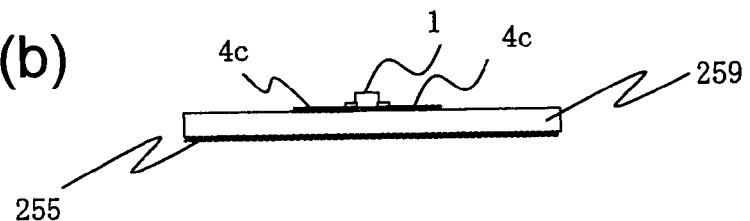
Figure 17A:
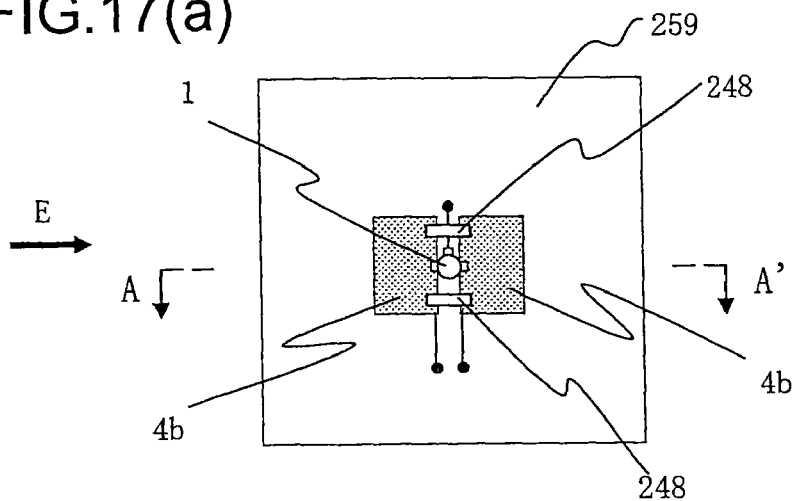
FIGS. 17(*a*) and (*b*) are schematic diagrams of a fourth example structure of resonating cavities that can be applied to the present invention.
Figure 17B:
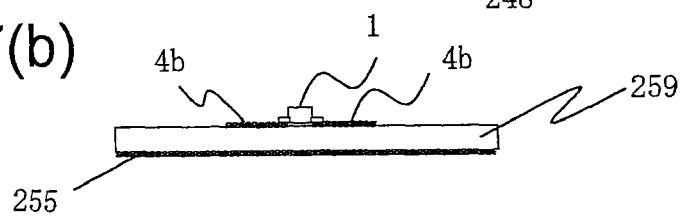

FIG. 14 shows a first modification example in which a pair of rectangular conductor patches 4a and 4a is provided axially symmetrically, FIG. 15 shows a second modification example in which a pair of rectangular conductor patches 4b is provided axially symmetrically, and FIG. 16 shows a third modification example in which a pair of round conductor patches 4c is provided axially symmetrically. Conductor patches may have other shapes such as triangular shapes and other such polygonal shapes, oval shapes, and fan shapes and the like. In FIGS. 14 to 16, the direction of the electric field is represented by the arrow E so as to indicate the principal polarization plane. For each of the conductor patches 4a to 4c, a GND conductor face 255 is equivalent to the inner layer GND 12. For each of the conductor patches 4a to 4c, a dielectric substrate 259 is equivalent to the front surface side dielectric substrate 10. The conductor patches 4a to 4c, the GND conductor face 255, and the dielectric substrate 259 form resonating cavities and part of the feedback circuit for oscillation operations. However, the GND conductor face 255 and the dielectric substrate 259 do not have to be provided if the feedback can be properly obtained. For example, when the conductor patches are manufactured by sheet-metal processing and there is a mechanism for holding the conductor patch sheets, the dielectric substrate 259 portion may be hollow. Also, as in a fourth modification example shown in FIG. 17, feedback components 248 such as chip capacitors for facilitating the above feedback may be mounted on the conductor patches 4b. Since the radiation is performed in the two plane directions of the conductor patch sheets when there is no GND conductor face 255, utilizing this two-plane radiation makes it possible to ensure a communication range over a wider angle range than in a case in which there is a GND conductor face.

Figure 18A:
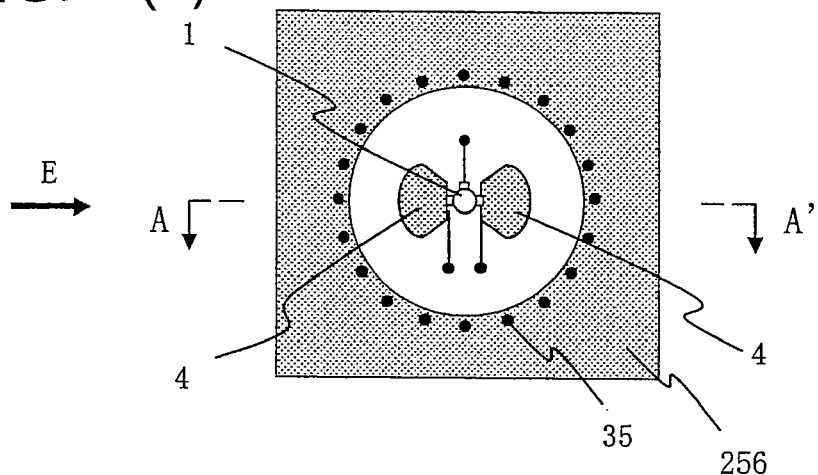
FIGS. 18(*a*) and (*b*) are schematic diagrams of a fifth example structure of resonating cavities that can be applied to the present invention.
Figure 18B:
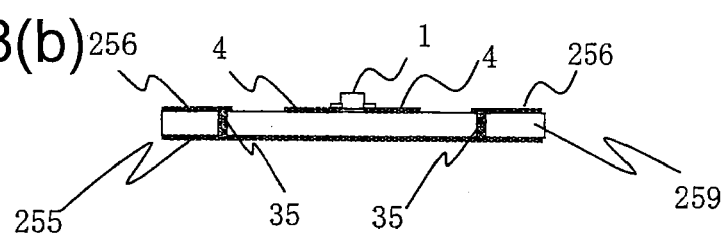

A fifth modification example shown in FIG. 18 is an example in which a GND conductor face 256 and throughholes 35 connecting the GND conductor face 256 to the GND conductor face 255 are provided around the roughly fanshaped conductor patches 4 and 4, preventing signal transmission in the inside of the dielectric substrate 259 and leakage from the end of the substrate. By properly setting the size and shape of the GND conductor face 256, instead of the signal being transmitted in the inside of the dielectric substrate 259, the amount of signal energy that would thus be lost can be utilized as the original radiation energy.

FIG. 19 shows a sixth modification example in which resonating cavities for oscillation are formed with rectangular conductor patches 4d and 4d and a ground conductor face 256d that is disposed to maintain appropriate spaces 244 from the conductor patches 4d and 4d.

FIG. 20 shows a seventh modification example in which resonating cavities for oscillation are formed by providing rectangular conductor patches 4e2 and 4e2 that are not connected to the high-frequency transistor 1, in the vicinity of rectangular conductor patches 4e1 and 24e1 that are connected to the high-frequency transistor 1. The conductor patches 4e1 and the conductor patches 4e2 are separated from each other and from the ground conductor face 256e by spaces 244e.

Figure 21A:
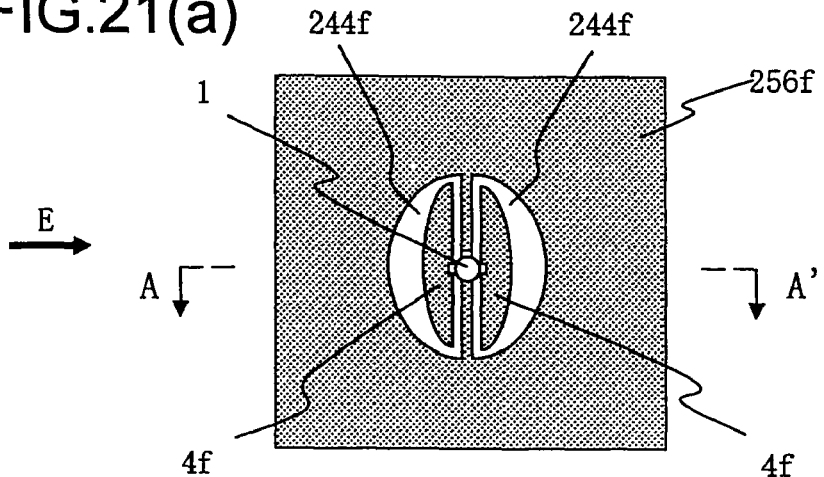
FIGS. 21(*a*) and (*b*) are schematic diagrams of an eighth example structure of resonating cavities that can be applied to the present invention.
Figure 21B:
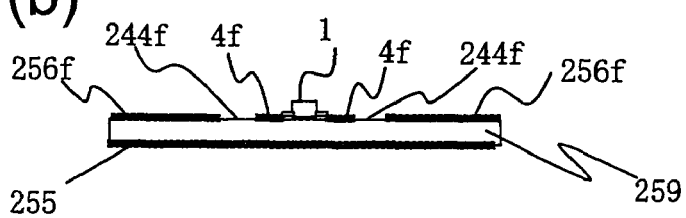

FIG. 21 shows an eighth modification example in which resonating cavities for oscillation are formed by semi-elliptical conductor patches 4f and 4f, and a ground conductor face 256f that is disposed to maintain appropriate spaces 244f from the conductor patches 4f and 4f. The width of the spaces 244f is varied in accordance with the location so as to satisfy an oscillation condition.

The shapes of the conductor patches and spaces are not limited to those of the above-described modification examples shown in FIGS. 18 to 21, and any structures that satisfy an oscillation condition can be applied to the present invention. Also, while the conductor patches, the spaces, the GND conductor face, and the dielectric substrate form part of a feedback circuit for oscillation operations, the dielectric substrate 259 and the GND conductor face 255 do not have to be provided if the feedback can be properly obtained. When there is no GND conductor face 255, the radiation is performed in the directions of both sides of the conductor patch plane.

Figure 22A:
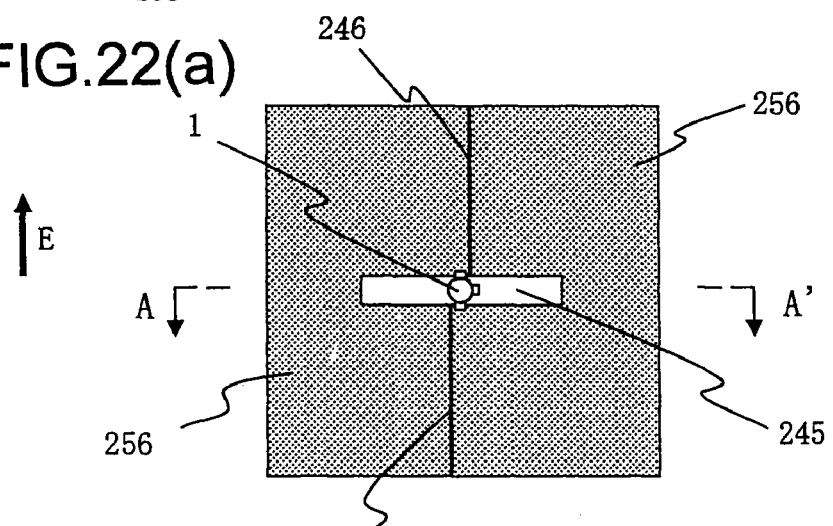
FIGS. 22(*a*) and (*b*) are schematic diagrams of a ninth example structure of resonating cavities that can be applied to the present invention.
Figure 22B:
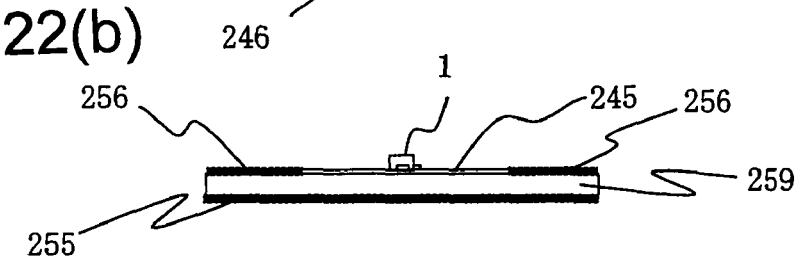

FIG. 22 shows a ninth modification example in which resonating cavities for oscillation are formed by a slot 245 and a ground conductor face 256. The slot 245 is in a complementary relationship with the rectangular conductor patches 4a illustrated in FIG. 14, and satisfies an oscillation condition. There is no particular limitation on the shape of the slot 245, as long as the oscillation condition is satisfied, of course. In this example structure, to apply different direct-current bias voltages to the gate and drain of the high-frequency transistor 1, the gate and the drain are galvanically isolated, and a capacitance coupling unit 246 for high-frequency conduction is provided. This capacitance coupling unit 246 may be realized by using space-based capacitance, a MIM (Metal-Insulator-Metal) capacitance, capacitor components, and so forth. The dielectric substrate 259 and the GND conductor face 255 do not have to be provided. When there is no GND conductor face 255, the radiation is performed in the directions of both sides of the conductor patch plane.

The above-described conductor patches are all examples of pairs of conductor patches provided symmetrically on the high-frequency transistor 1, but asymmetrically shaped conductor patches may be used.

Figure 23A:
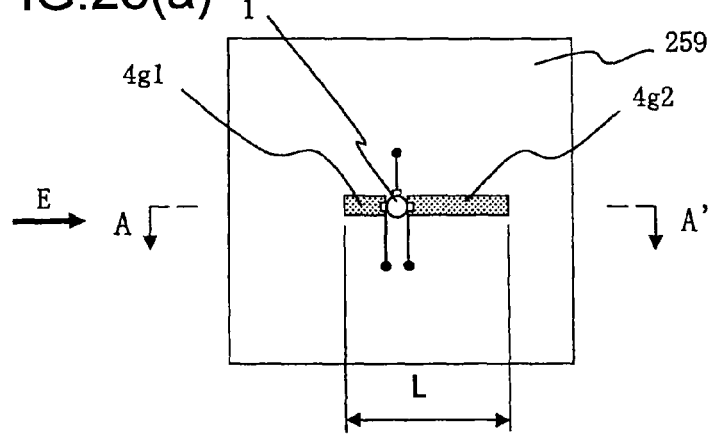
FIGS. 23(*a*) and (*b*) are schematic diagrams of a tenth example structure of resonating cavities that can be applied to the present invention.
Figure 23B:
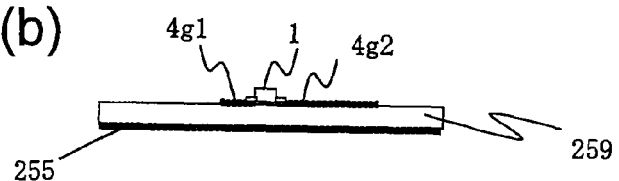

FIG. 23 shows a tenth modification example in which a rectangular first conductor patch 4g1 and a rectangular second conductor patch are formed asymmetrically. Even if the first conductor patch 4g1 and second conductor patch 4g2 are thus shaped asymmetrically, the resonance frequency is basically determined by the overall size of the conductor patch unit (shown by L in FIG. 23(a)), so can be operated as a radiation type oscillator in which an antenna and oscillation circuit form an integrated whole, as long as an oscillation condition is satisfied.

Figure 24A:
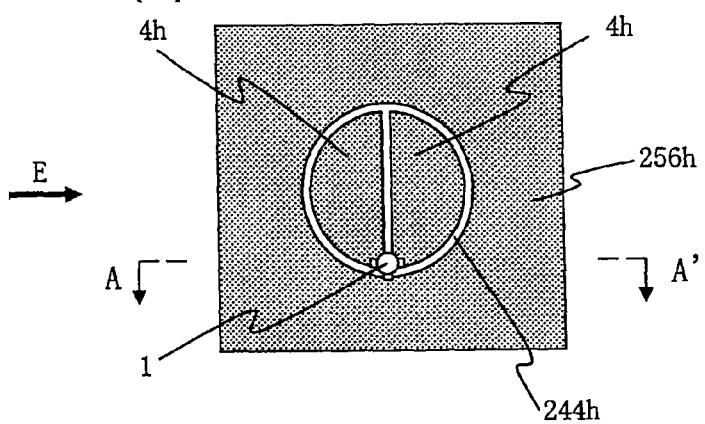
FIGS. 24(*a*) and (*b*) are schematic diagrams of an eleventh example structure of resonating cavities that can be applied to the present invention.
Figure 24B:
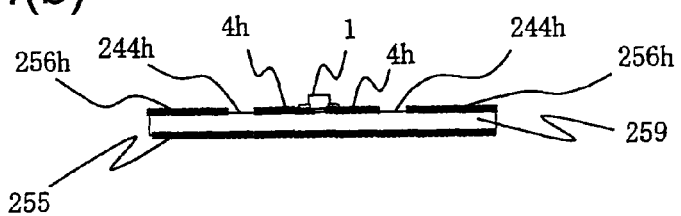

FIG. 24 shows an eleventh modification example in which resonating cavities for oscillation are formed by roughly halfround conductor patches 4h and 4h, and aground conductor face 256h disposed to maintain an appropriate space 244h from the conductor patches 4h and 4h, forming a ring-slot antenna on the radiation face side.

Figure 25A:
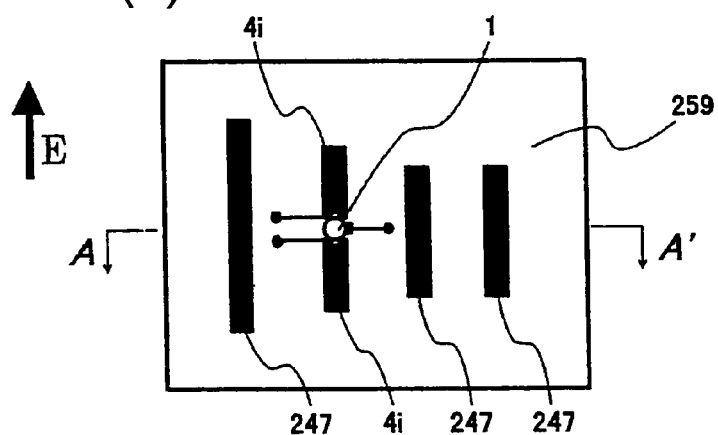
FIGS. 25(*a*) and (*b*) are schematic diagrams of a twelfth example structure of resonating cavities that can be applied to the present invention.
Figure 25B:
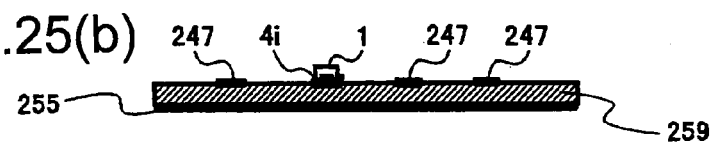

FIG. 25 shows a twelfth modification example in which conductor patches 247 not connected to the high-frequency transistor 1 are placed appropriately around rectangular conductor patches 4 and 4 to enable the radiation directivity to be controlled. By appropriately setting the positional relationship and size relationship of the conductor patches 4i and 4i and conductor patches 247, this can be operated like a Yagi antenna, for example.

Also, when the injection-locking operation of this invention is considered, the synchronization performance can be controlled by the shape of the resonating cavities. For example, a desired synchronization performance can be realized with a simple design by using the adjustment of conductor patch or slot shape to set a suitable frequency range, lock range and high-speed tracking for the arriving signal.

The microwave/millimeter wave communication apparatus according to the present invention has been described in the foregoing with reference to a number of embodiments. However, the invention is not limited to those embodiments, but includes all microwave/millimeter wave communication apparatuses that can be embodied without changing the structures described in the claims.

The features of each microwave/millimeter wave communication apparatus according to the present invention, such as low cost and low power consumption, are advantageous in practical use where the apparatus is used in a system or measurement test device that uses a large number of sensors. In particular, the microwave/millimeter wave communication apparatus is expected to have a major advantage over millimeter wave band communication systems and apparatuses that have a high component cost and low power efficiency due to increased transmission loss and device performance.

The simple structure of the microwave/millimeter wave communication apparatus according to the present invention is advantageous particularly in restricting variations in characteristics and securing a high manufacturing yield in the quality control during the process for manufacturing millimeter wave devices that depend on precise, fine thin-film process techniques, and millimeter wave band apparatuses that use those millimeter wave devices, enabling high reliability and low cost to be realized. Due to these advantages, the microwave/millimeter wave communication apparatus according to the present invention is suitable for use in a sensor network, a millimeter wave band data transmission system, a hospital internal wireless network, and an inter-board communication system and the like.

The above sensor network is a system that ensures synchronization of apparatuses in the network by placing the communication apparatus of the present invention at many points in an area where sensing is performed, such as a no-entry area, with arbitrary adjacent apparatuses in an injection-locked state. By connecting each of the communication apparatuses in the network with various sensors and making the sensed information a baseband signal input, information sensed by one sensor will be instantly transmitted to other communication apparatuses within the network in which synchronization has been secured. Utilizing the low power consumption characteristics of the apparatus makes it possible to realize a microwave/millimeter wave sensor network that uses small solar cells or the like as a power source.

The above millimeter wave band data transmission system is, for example, a 60 GHz band video transmission system. The communication apparatus of the present invention is a structure that can be mounted on a video player and monitor, respectively, and, further, the apparatus can be placed between a video player and monitor as a repeater. A system in which high straight-line-performance millimeter waves are not blocked by the human body or the like can be realized by using a plurality of repeaters. When the present apparatus is used as a repeater, baseband signal input/output is unnecessary, as it may be used as an injection-locking-operation RF amplifier.

Like the above millimeter wave band data transmission system, the above hospital internal wireless network is a system that uses the communication apparatus as a transmitter/receiver or repeater. Systems that use radio waves of quasi-millimeter wave bands and millimeter wave bands that have less effect on the operation of other electronic devices than radio waves of quasi-millimeter wave bands that are increasingly used by mobile telephones and the like can be realized at low cost. Also, by providing the apparatus with a horn structure that sharpens the radiation directivity, the radio waves can be made to exist only on a narrow path. This would be particularly advantageous in a hospital, where it is necessary to exclude the effects of outside radio waves that cause medical equipment and cardiac pacemakers and the like to malfunction.

The above inter-board communication system is a system that carries out the transmission of data between various boards in a computer housing, for example. Mounting the communication apparatus on each of the boards in the housing can eliminate complex wiring connections, reducing the number of assembly steps. Using this millimeter wave band communication apparatus enables components to be miniaturized, and because communication is performed at frequencies that are much higher than the frequency bands of signals used by computers, there are no worries about mutual interference or the like.

INDUSTRIAL APPLICABILITY

The microwave/millimeter wave communication apparatus according to the present invention makes it possible to solve the problems of complex structure, high cost and high power consumption that have hindered the dissemination of microwave/millimeter wave communication and provide a microwave/millimeter wave communication apparatus that has a simple structure, low cost, and low power consumption.

The invention claimed is:

1. A microwave/millimeter wave communication apparatus, comprising:
    a radiation type oscillator formed by integrating a three-electrode high-frequency amplifying device to generate negative resistance at a resonating cavity, and share a function to emit an electromagnetic wave to space;
    wherein during transmission, an oscillation frequency of the radiation type oscillator is varied in accordance with a baseband signal amplitude to frequency modulate a radiation wave as a transmit RF signal, and
    during reception, demodulation operation is performed by the oscillation of the radiation type oscillator being injection-locked on a receive RF signal arriving from outside that is frequency modulated in accordance with baseband signal amplitude, generating a change in oscillation frequency of the radiation type oscillator that is a same as a frequency change of the receive RF signal, and obtaining a baseband signal amplitude from a change in bias of the three-electrode high-frequency amplifying device due to the oscillation frequency change.

2. A microwave/millimeter wave communication apparatus according to claim 1, wherein:
    the three electrodes of the three-electrode high-frequency amplifying device of the radiation type oscillator are a controlled-current entering electrode, a controlled-current exiting electrode, and a control electrode,
    a bias control circuit that varies bias in accordance with baseband signal amplitude is provided between a high-potential side of a direct-current power source supply path and the controlled-current entering electrode, or between a low-potential side of a direct-current power source supply path and the controlled-current exiting electrode,
    during transmission, modulation operation is performed by having the bias control circuit vary oscillation frequency of the radiation type oscillator,
    during reception, the bias control circuit is operated as an active load to form a baseband frequency band load of the three-electrode high-frequency amplifying device, and baseband signal amplitude is obtained from change in bias of the controlled-current entering electrode or controlled-current exiting electrode.

3. A microwave/millimeter wave communication apparatus according to claim 1, wherein:
- the three electrodes of the three-electrode high-frequency amplifying device of the radiation type oscillator are a controlled-current entering electrode, a controlled-current exiting electrode, and a control electrode,
- a baseband frequency band load is provided between a high-potential side of a direct-current power source supply path and the controlled-current entering electrode, or between a low-potential side of a direct-current power source supply path and the controlled-current exiting electrode,
- during transmission, modulation operation is performed by varying the control electrode bias in accordance with baseband signal amplitude to vary oscillation frequency of the radiation type oscillator,
- during reception, baseband signal amplitude is obtained from change in bias of the controlled-current entering electrode or controlled-current exiting electrode due to baseband frequency band load.

4. A microwave/millimeter wave communication apparatus according to claim 1, wherein:
- the three electrodes of the three-electrode high-frequency amplifying device of the radiation type oscillator are a controlled-current entering electrode, a controlled-current exiting electrode, and a control electrode,
- an impedance varying unit is formed with a variable impedance device that is provided at a resonating cavity of the radiation type oscillator,
- a baseband frequency band load is provided between a high-potential side of a direct-current power source supply path and the controlled-current entering electrode, or between a low-potential side of a direct-current power source supply path and the controlled-current exiting electrode,
- during transmission, modulation operation that varies oscillation frequency in accordance with baseband signal amplitude applied to the impedance varying device is performed,
- during reception, baseband signal amplitude is obtained from change in bias of the controlled-current entering electrode or controlled-current exiting electrode due to baseband frequency band load.

* * * * *